US012808902B2

(12) United States Patent
Konishi et al.

(10) Patent No.: US 12,808,902 B2
(45) Date of Patent: Nov. 24, 2026

(54) INSPECTION METHOD AND INSPECTION DEVICE

(71) Applicant: TOKYO ELECTRON LIMITED, Tokyo (JP)

(72) Inventors: Kentaro Konishi, Yamanashi (JP); Tomoya Endo, Yamanashi (JP); Hiroki Shikagawa, Yamanashi (JP); Tomoki Nukanobu, Yamanashi (JP); Hiroaki Sakamoto, Yamanashi (JP); Yasuhiro Murata, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 229 days.

(21) Appl. No.: 18/852,061

(22) PCT Filed: Mar. 16, 2023

(86) PCT No.: PCT/JP2023/010422
§ 371 (c)(1),
(2) Date: Sep. 27, 2024

(87) PCT Pub. No.: WO2023/189676
PCT Pub. Date: Oct. 5, 2023

(65) Prior Publication Data

US 2025/0208169 A1 Jun. 26, 2025

(30) Foreign Application Priority Data

Mar. 30, 2022 (JP) ................................ 2022-056364
Oct. 12, 2022 (JP) ................................ 2022-163809

(51) Int. Cl.
*G01R 1/073* (2006.01)
*G01R 1/067* (2006.01)
(Continued)

(52) U.S. Cl.
CPC ..... *G01R 1/07342* (2013.01); *G01R 1/06716* (2013.01); *G06T 7/001* (2013.01);
(Continued)

(58) Field of Classification Search
CPC ............ G01R 1/06716; G01R 1/07342; G01R 31/28; G01R 31/2891; G06T 2207/30148;
(Continued)

(56) References Cited

U.S. PATENT DOCUMENTS

2003/0025517 A1* 2/2003 Kiest .................. H10P 72/0616 257/E23.021
2020/0174040 A1* 6/2020 Tamura ................. G01R 1/071

FOREIGN PATENT DOCUMENTS

JP 2014-106216 A 6/2014
JP 2020-091147 A 6/2020
JP 2021-166228 A 10/2021

OTHER PUBLICATIONS

PCT International Search Report and Written Opinion, PCT Application No. PCT/JP2023/010422, May 30, 2023, 8 pages (with English translation of International Search Report).

* cited by examiner

*Primary Examiner* — Judy Nguyen
*Assistant Examiner* — Brent J Andrews
(74) *Attorney, Agent, or Firm* — Fenwick & West LLP

(57) ABSTRACT

An inspection method for inspecting a substrate using an inspection device, comprises (A) moving a placing member on which a substrate is placed to a position below a probe card held by a holder; (B) imaging the substrate placed on the placing member by a first imaging unit and imaging probes of the probe card by a second imaging unit from a gap between the probe card and the placing member; (C) moving the placing member to a reference position in a horizontal direction. The method further comprises (D) lifting the
(Continued)

placing member and imaging a target provided at the holder by a third imaging unit that moves together with the placing member; and (E) correcting a contact position calculated from imaging results obtained by the first and the second imaging units in said (B) based on an imaging result obtained by the third imaging unit in said (D).

24 Claims, 13 Drawing Sheets

(51) Int. Cl.
*G06T 7/00* (2017.01)
*G06T 7/73* (2017.01)

(52) U.S. Cl.
CPC ...... *G06T 7/74* (2017.01); *G06T 2207/30148* (2013.01); *G06T 2207/30204* (2013.01)

(58) Field of Classification Search
CPC ......... G06T 2207/30204; G06T 7/0004; G06T 7/001; G06T 7/74; H10P 10/00; H10P 14/00; H10P 30/00; H10P 32/00; H10P 34/00; H10P 36/00; H10P 50/00; H10P 52/00; H10P 54/00; H10P 56/00; H10P 58/00; H10P 70/00; H10P 72/00; H10P 76/00; H10P 95/00; H10P 90/00
See application file for complete search history.

INSPECTION METHOD AND INSPECTION DEVICE

TECHNICAL FIELD

The present disclosure relates to an inspection method and an inspection device.

BACKGROUND

Patent Document 1 discloses an inspection device for moving a wafer placed on an alignment stage to a position where the wafer is brought into contact with probes of a probe card. The inspection device performs processing including a step of acquiring card center coordinates of the probe card with a first acquisition part on the aligner side, and a step of acquiring reference coordinates in a target coordinate system of a reference target disposed at a pogo frame with the first acquisition part. Further, the inspection device performs processing including a step of acquiring common coordinates of the first acquisition part and a second acquisition part on the pogo frame side, a step of acquiring wafer center coordinates with the second acquisition part, and a step of moving an aligner by a command including contact coordinates determined based on the card center coordinates, the common coordinates, and the wafer center coordinates.

PRIOR ART DOCUMENTS

Patent Documents

Patent document 1: Japanese Laid-open Patent Publication No. 2021-166228

SUMMARY

Problems to Be Resolved by the Invention

The technique of the present disclosure allows more accurate alignment between a substrate and probes of a probe card in an inspection device for inspects the substrate.

Means for Solving the Problems

In accordance with one embodiment of the present disclosure, An inspection method for inspecting a substrate using an inspection device, comprising:

(A) moving a placing member on which a substrate is placed to a position below a probe card held by a holder;

(B) thereafter, imaging the substrate placed on the placing member by a first imaging unit and imaging probes of the probe card by a second imaging unit from a gap between the probe card and the placing member;

(C) moving the placing member to a reference position in a horizontal direction;

(D) lifting the placing member from the reference position and imaging a target provided at the holder by a third imaging unit that moves together with the placing member; and (E) correcting a contact position, which is calculated from imaging results obtained by the first imaging unit and the second imaging unit in said (B), based on an imaging result obtained by the third imaging unit in said (D).

Effect of the Invention

In accordance with the present disclosure, in an inspection device for inspecting a substrate, it is possible to more accurately align the substrate and the probes of the probe card.

DETAILED DESCRIPTION

In a semiconductor manufacturing process, a plurality of semiconductor devices having a predetermined circuit pattern are formed on a substrate such as a semiconductor wafer (hereinafter, referred to as "wafer"). The electrical characteristics of the formed semiconductor devices are inspected to classify them into non-defective products and defective products. For example, the semiconductor devices are inspected using an inspection apparatus before the substrate is divided into the semiconductor devices.

The inspection apparatus includes a probe card having a plurality of probes that are needle-shaped contact terminals. In the electrical characteristic inspection, first, the wafer and the probe card become close to each other, and the probes of the probe card are brought into contact with electrodes of the semiconductor devices formed on the substrate. In that state, an electrical signal is supplied from a test head disposed above the probe card to the semiconductor devices through the probes. Then, based on the electrical signal received by the test head from the semiconductor devices through the probes, the corresponding semiconductor devices are classified into defective products or non-defective products.

In order to appropriately perform the electrical characteristic inspection, the inspection device aligns the probes of the probe card with the wafer, specifically, aligns the probes with the electrodes on the wafer.

Figure 1:
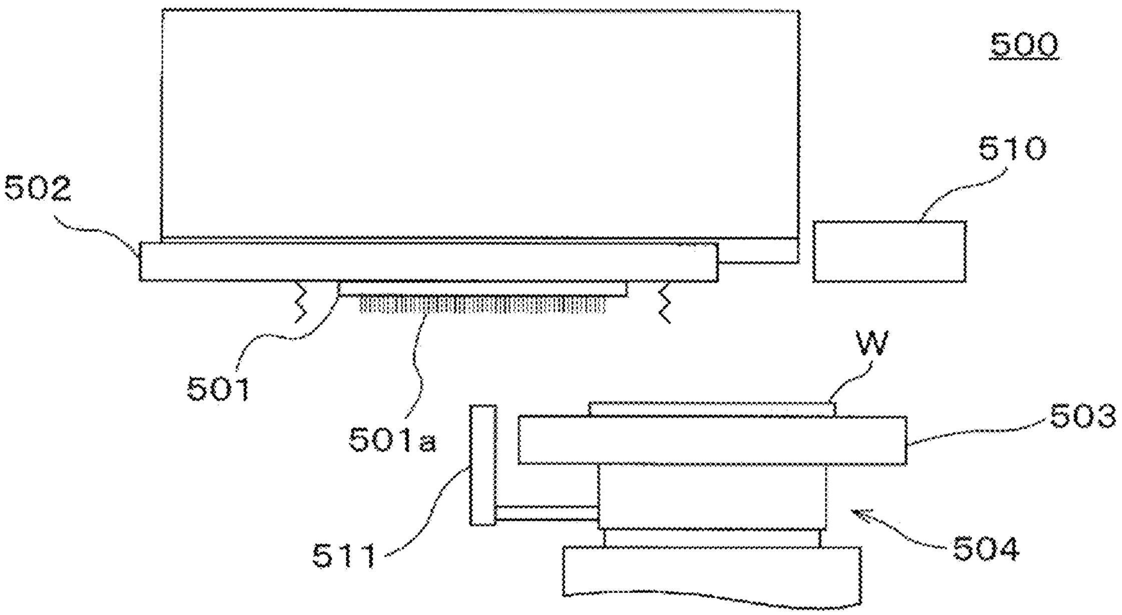
FIG. 1 explains an alignment method according to a comparative embodiment.
Figure 2:
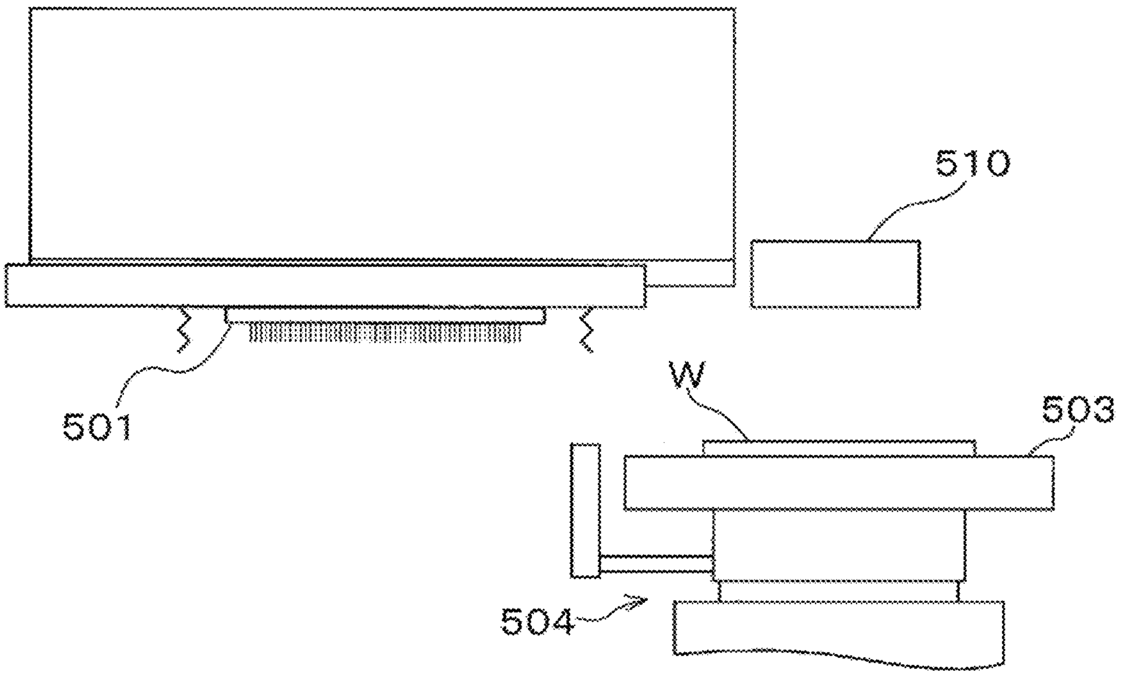
FIG. 2 explains an alignment method according to the comparative embodiment.

As shown in FIG. 1, the inspection device 500 includes, e.g., a pogo frame 502 for holding a probe card 501, a chuck top 503 on which a wafer W is placed, and an aligner 504 for moving the chuck top 503. In the inspection device 500, an upper camera 510 for recognizing a wafer is disposed in an area that does not overlap the probe card 501 in plan view, and a lower camera 511 for recognizing a probe card is fixed to the aligner 504. In the inspection device 500, the probes 501*a* of the probe card 501 are aligned with the wafer W on the chuck top 503 based on the following imaging results, for example.

imaging result of the probe card 501 by the lower camera 511 in a state where the lower camera 511 is moved to a position below the probe card 501 as shown in FIG. 1.

imaging result of the wafer W on the chuck top 503 by the upper camera 510 in a state where the chuck top 503 is moved to a position below the upper camera 510 located in an area that does not overlap the probe card 501 in plan view, as shown in FIG. 2.

However, the above-described alignment method needs to be improved in terms of alignment accuracy.

The technique of the present disclosure allows more accurate alignment between the substrate and the probes of the probe card in a substrate inspection device.

Hereinafter, the inspection method and the inspection device according to the present embodiment will be described with reference to the accompanying drawings. Like reference numerals will be used for like parts having substantially the same functions and configurations throughout the specification and the drawings, and redundant description thereof will be omitted.

<Inspection Device>

Figure 3:
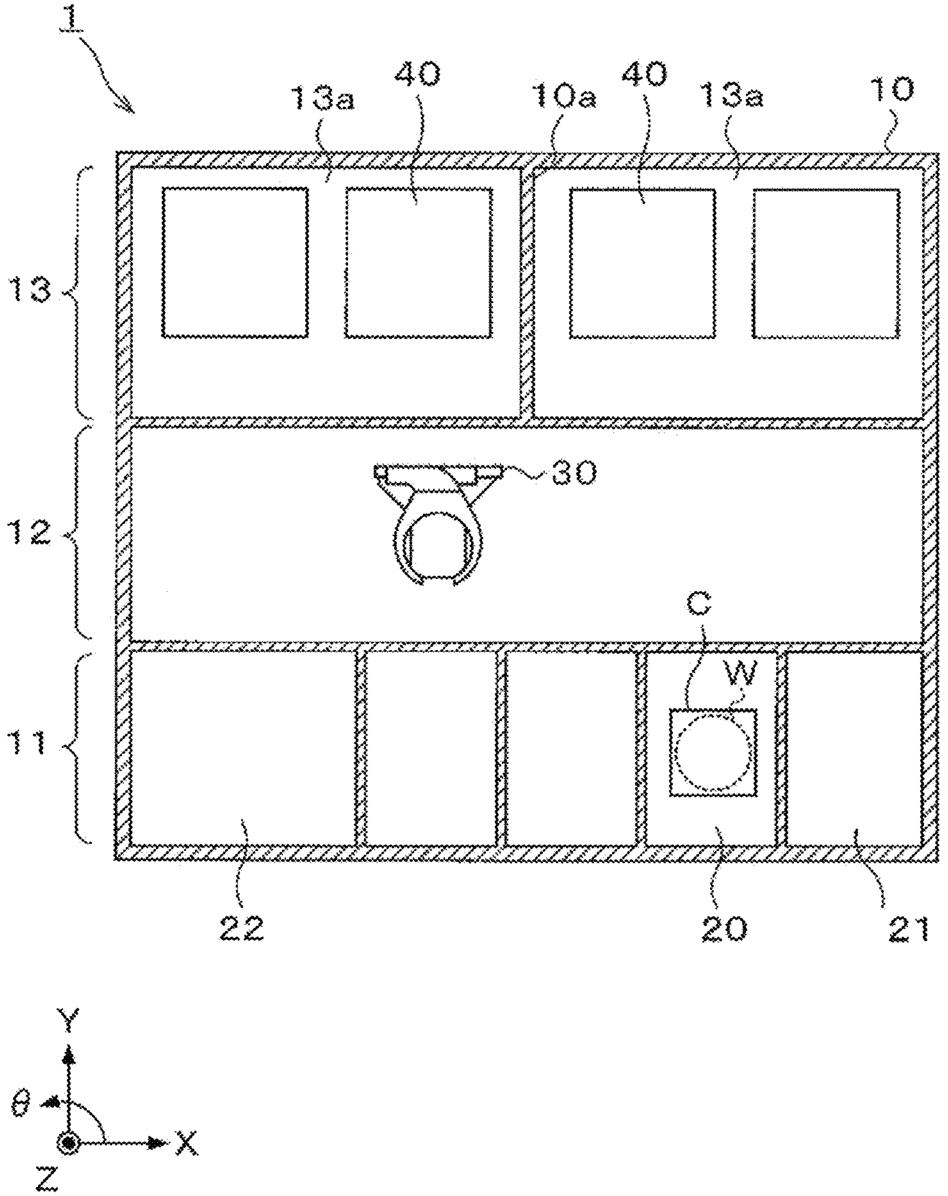
FIG. 3 is a horizontal cross-sectional view schematically showing a configuration of an inspection device according to the present embodiment.
Figure 4:
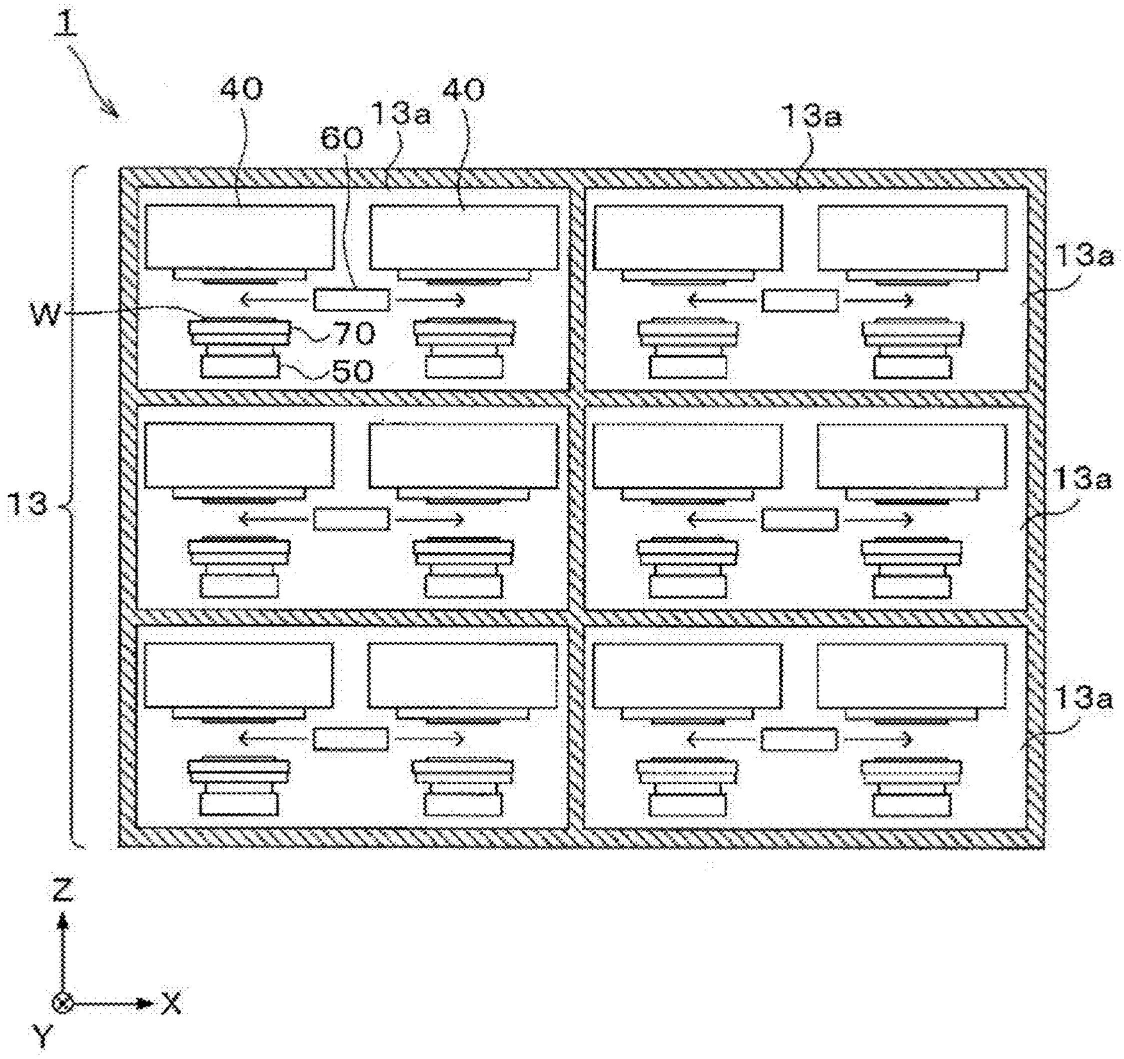
FIG. 4 is a vertical cross-sectional view schematically showing the configuration of the inspection device according to the present embodiment.

FIGS. 3 and 4 are respectively a horizontal cross-sectional view and a vertical cross-sectional view schematically showing the configuration of the inspection device according to the present embodiment.

The inspection device 1 shown in FIGS. 3 and 4 inspects a wafer W as a substrate, and more specifically, inspects the electrical characteristics of semiconductor devices as inspection target devices formed on the wafer W. The inspection device 1 has a housing 10 where a loading/unloading area 11, a transfer area 12, and an inspection area 13 are provided. In the loading/unloading area 11, the wafer W is loaded into and unloaded from the inspection device 1. The transfer area 12 connects the loading/unloading area 11 and the inspection area 13. In the inspection area 13, the electrical characteristics of the semiconductor devices formed on the wafer W are inspected.

Provided in the loading/unloading area 11 are a port 20 for receiving a cassette C containing a plurality of wafers W, a loader 21 accommodating a probe card to be described later, and a controller 22 for controlling individual components of the inspection device 1. The controller 22 is a computer including a central processing unit (CPU), a memory, or the like, and has a storage part (not shown) that stores various information. The storage part stores, e.g., a program including instructions for the inspection process. The program may be recorded in a computer-readable storage medium, and installed from the storage medium to the controller 22. The storage medium may be temporary or non-temporary. The program may be partially or entirely realized by dedicated hardware (circuit board). The storage part may be, e.g., a storage device such as a hard disk drive (HDD), a memory such as a random access memory (RAM) that stores temporarily required information related to the operation of the program, or a combination thereof.

A transfer device 30 that can freely move while holding a wafer W or the like is disposed in the transfer area 12. The transfer device 30 transfers the wafer W between the cassette C in the port 20 in the loading/unloading area 11 and the inspection area 13. Further, the transfer device 30 transfers a probe card that require maintenance, among probe cards fixed to a pogo frame to be described later in the inspection area 13, to the loader 21 in the loading/unloading area 11. Further, the transfer device 30 transfers a new probe card or a probe card subjected to maintenance from the loader 21 into the inspection area 13.

A plurality of testers 40 are disposed in the inspection area 13. Specifically, as shown in FIG. 4, for example, the inspection area 13 is divided into three areas in a vertical direction (Z direction in FIG. 4) and two areas in a horizontal direction (X direction in FIG. 4), and two testers 40 arranged in the horizontal direction are provided in each divided area 13*a*. Further, an aligner 50 as a moving mechanism for each tester 40 is provided in each divided area 13*a*. Moreover, one imaging part 60 is provided in each divided area 13*a*. In other words, in each divided area 13*a*, the imaging part 60 is commonly used for the testers 40 adjacent in the horizontal direction. The number or arrangement of the testers 40, the aligners 50, and the imaging parts 60 may be randomly selected.

The tester 40 transmits and receives an electrical signal for electrical characteristic inspection to and from the wafer W.

The aligner 50 is configured to hold a chuck top 70 to be described later and move it in the horizontal direction (X direction and Y direction in FIG. 4, 0 direction around the Z axis in FIG. 3) and the vertical direction (Z direction in FIG. 3 and FIG. 4). Further, the aligner 50 is used for aligning the wafer W placed on the chuck top 70 with probes of a probe card to be described later.

The imaging part 60 images both the probes of the probe card and the wafer W placed on the chuck top 70.

The chuck top 70 is an example of a placing member on which the wafer W is placed. The chuck top 70 can hold the wafer W placed thereon by attraction, for example.

In the inspection device 1, while the transfer device 30 is transferring a wafer W toward one tester 40, the other tester 40 can inspect the electrical characteristics of electronic devices formed on another wafer W.

<Inspection Area>

Figure 5:
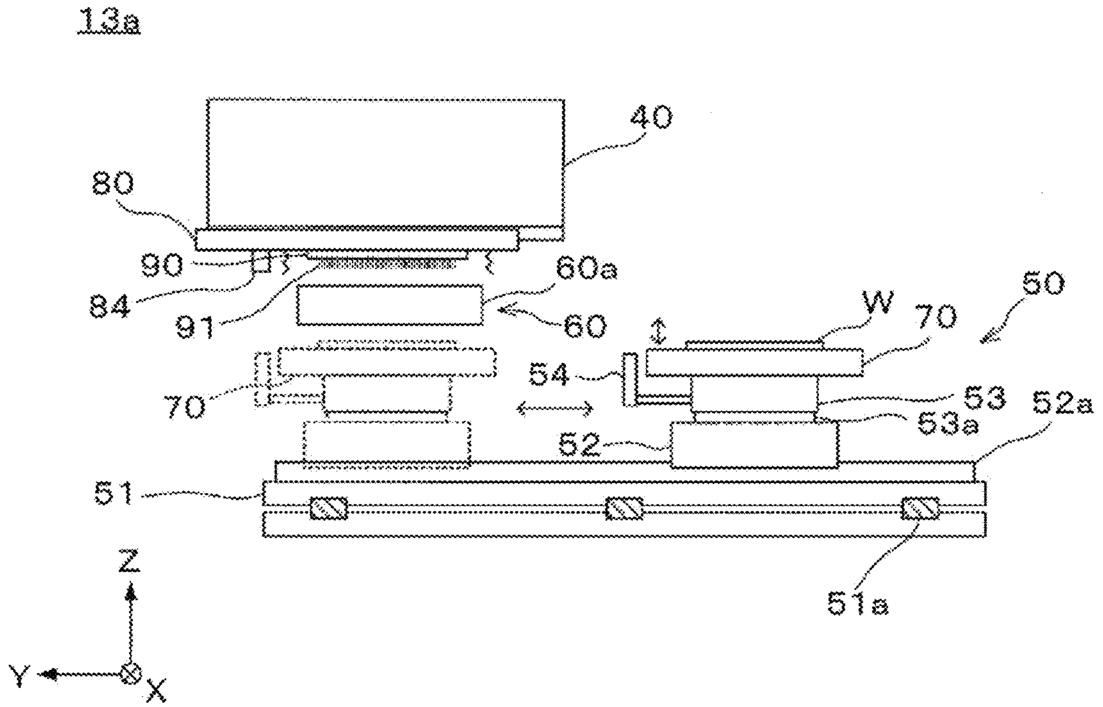
FIG. 5 is a side cross-sectional view of one divided area of an inspection area.
Figure 6:
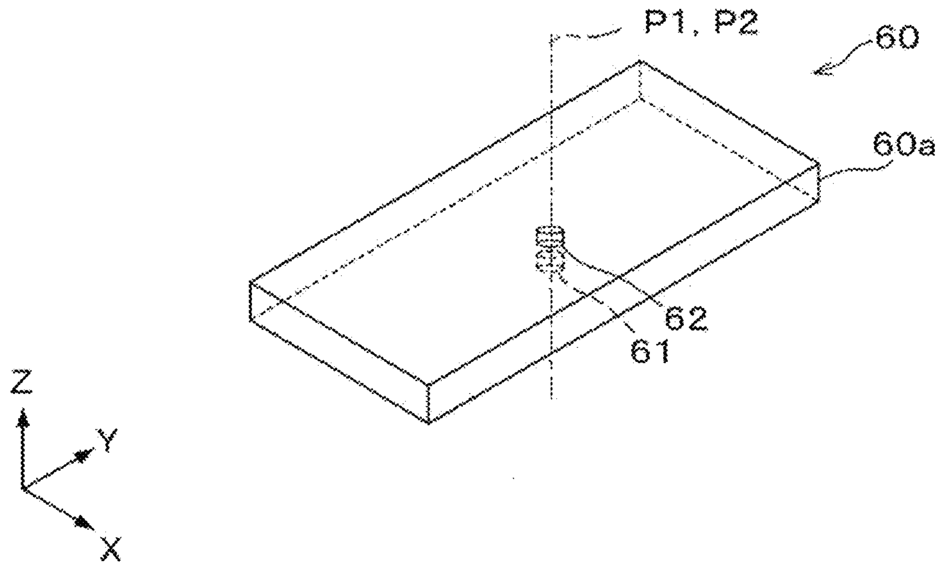
FIG. 6 is a perspective view of a housing of an imaging part.
Figure 7:
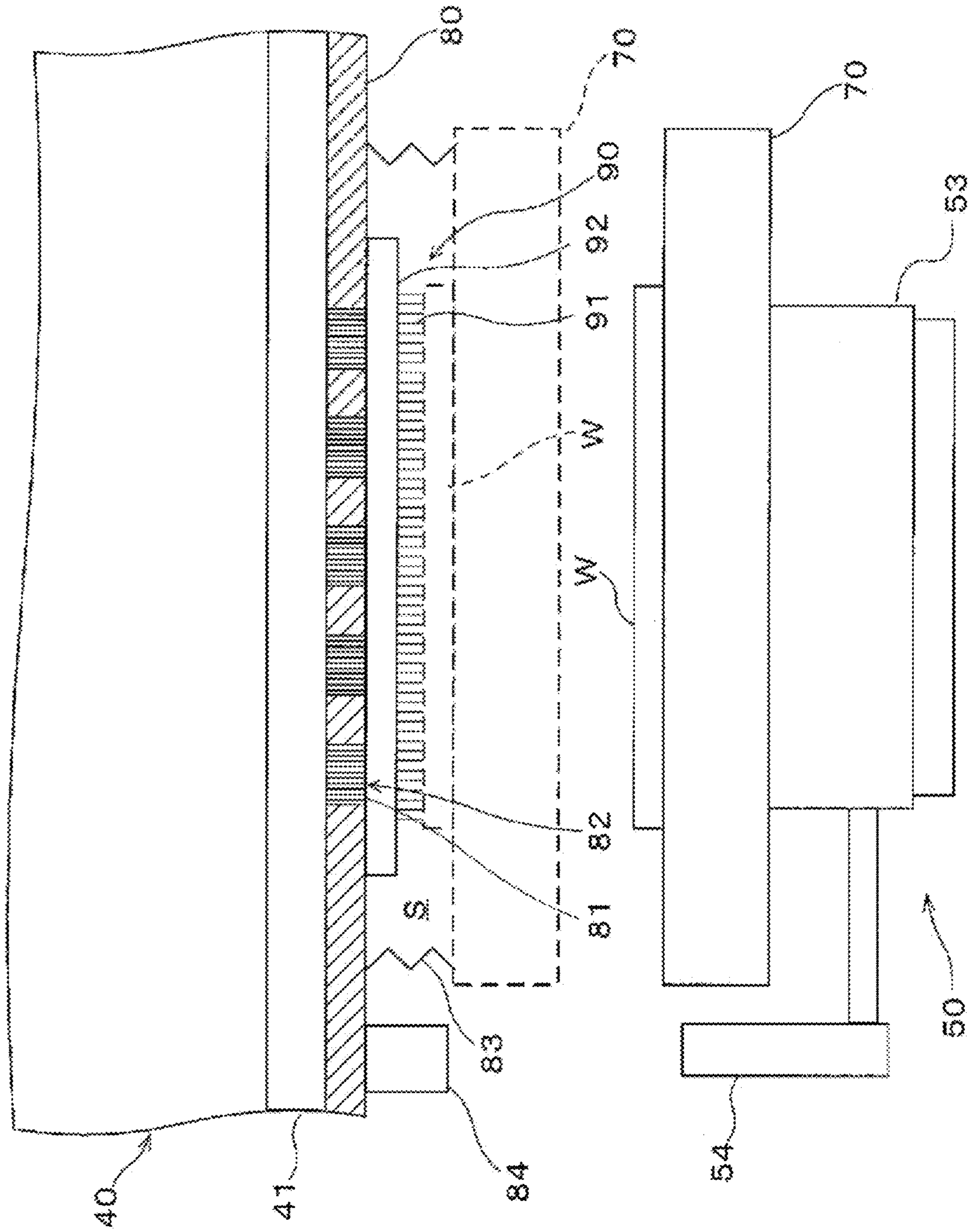
FIG. 7 is a cross-sectional view of neighboring parts of a pogo frame.
Figure 8:
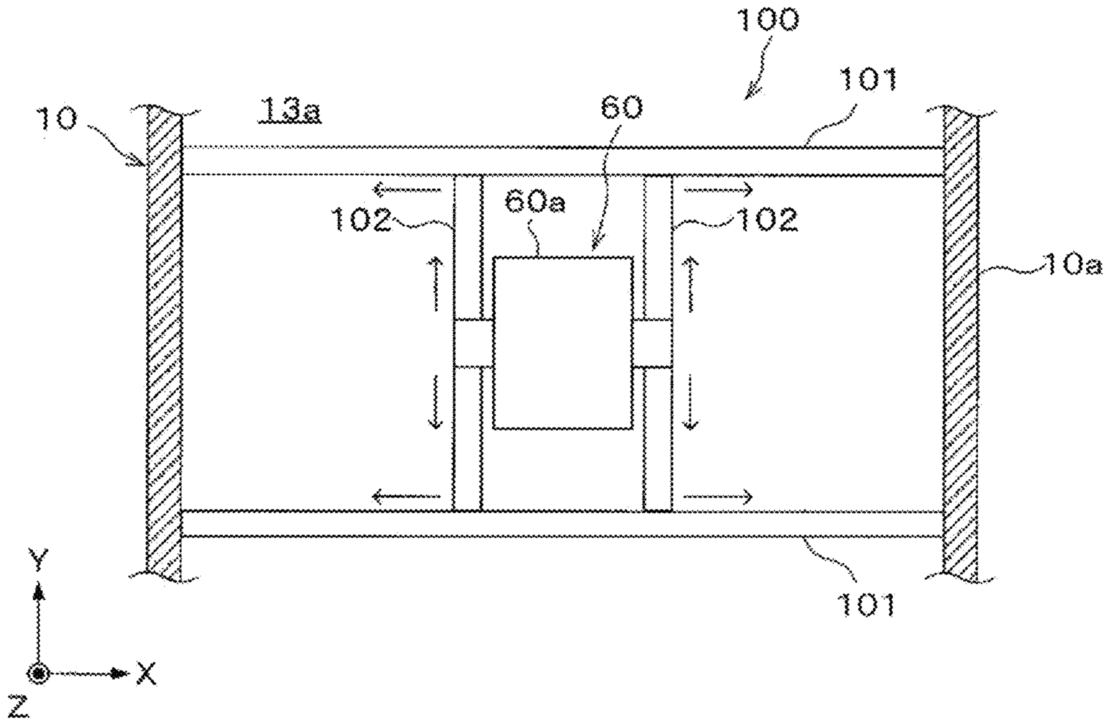
FIG. 8 is a top view of the imaging part.

Next, the configuration of the inspection area 13 will be described in detail with reference to FIGS. 5 to 8. FIG. 5 is a side cross-sectional view of one divided area 13*a* of the inspection area 13. FIG. 6 is a perspective view of the housing of the imaging part 60, which will be described later. FIG. 7 is a cross-sectional view of neighboring parts of a pogo frame to be described later. FIG. 8 is a top view of the imaging part 60.

As described above, the aligner 50 and the imaging part 60 are provided in each divided area 13*a* of the inspection area 13. Further, as shown in FIG. 5, a pogo frame 80 and a probe card 90, which will be described later, are provided in each divided area 13*a*.

The aligner 50 has, e.g., an X stage 51, a Y stage 52, and a Z stage 53.

The X stage 51 moves along a guide rail 51*a* extending in the horizontal direction (X direction in FIG. 5). A driving part (not shown) for driving the movement is provided for the X stage 51. The driving part has, e.g., a motor as a driving source that generates a driving force for the movement. Further, a position detection mechanism (not shown) is provided for the X stage 51 to detect the position of the X stage 51 in the X direction, i.e., the position of the chuck top 70 in the X direction. The position detection mechanism is, e.g., a linear encoder.

The Y stage 52 moves on the X stage 51. Specifically, the Y stage 52 moves along a guide rail 52*a* extending in the horizontal direction (Y direction in FIG. 5). A driving part (not shown) for driving the movement is provided for the Y stage 52. The driving part has, e.g., a motor as a driving source that generates a driving force for the movement. Further, a position detection mechanism (not shown) is provided for the Y stage 52 to detect the position of the Y stage 52 in the Y direction, i.e., the position of the chuck top 70 in the Y direction. The position detection mechanism is, e.g., a linear encoder.

The Z stage 53 moves up and down by an extensible/contractible shaft 53*a* capable of extending and contracting in the vertical direction (Z direction in FIG. 5). A driving part (not shown) for driving the movement is provided for the Z stage 53. The driving part has, e.g., a motor as a driving source that generates a driving force for the movement. Further, a position detection mechanism (not shown) is provided for the Z stage 53 to detect the position of the Z stage 53 in the Z direction, i.e., the position of the chuck top 70 in the Z direction. The position detection mechanism is, e.g., a linear encoder.

The chuck top 70 is detachably attracted and held on the Z stage 53. The chuck top 70 is attracted and held on the Z stage 53 by vacuum attraction using an attraction holding mechanism (not shown).

The Z stage 53 is provided with a rotation mechanism (not shown) for rotating the Z stage 53 around the Z axis. The rotation mechanism has a driving part for driving the rotation, and the driving part has, e.g., a motor as a driving source for generating a driving force for the rotation.

The aligner 50 is controlled by the controller 22. Specifically, the driving parts of the X stage 51, the Y stage 52, and the Z stage 53 of the aligner 50 are controlled by the controller 22. Further, the position detection results obtained by the position detection mechanisms disposed at the X stage 51, the Y stage 52, and the Z stage 53 are outputted to the controller 22.

In the present embodiment, an aligner-side imaging unit 54 (third imaging unit of the present disclosure) is fixed to the aligner 50. Specifically, the aligner-side imaging unit 54 is fixed to the Z stage 53 of the aligner 50. Therefore, when the chuck top 70 held by the aligner 50 is moved, the aligner-side imaging unit 54 is also moved. In other words, the aligner 50 moves the aligner-side imaging unit 54 together with the chuck top 70.

The aligner-side imaging unit 54 recognizes a correction target 84 disposed at the pogo frame 80 to be described below. Specifically, the aligner-side imaging unit 54 images the correction target 84 in order to recognize the correction target 84.

The aligner-side imaging unit 54 has a camera including an optical system such as lenses and a light receiving device (specifically, photoelectric conversion device).

The aligner-side imaging unit 54 is controlled by the controller 22. The imaging result obtained by the aligner-side imaging unit 54 is outputted to the controller 22.

The aligner 50 is provided with a projection target 110 (see FIG. 11 to be described below) configured to move back and forth in a direction intersecting the optical axis of the aligner-side imaging unit 54 with respect to the focal plane of the aligner-side imaging unit 54. The projection target 110 is disposed such that the center of the projection target 110 coincides with the focal point and the optical axis of the camera of the aligner-side imaging unit 54 when it is located at a position above the aligner-side imaging unit 54. The projection target 110 also moves integrally with the chuck top 70 by the aligner 50, similarly to the aligner-side imaging unit 54.

As described above, the imaging part 60 images both the probes 91 of the probe card 90 and the wafer W placed on the chuck top 70. The imaging part 60 has a housing 60*a*. As shown in FIG. 6, both the first imaging unit 61 and the second imaging unit 62 are fixed to the housing 60*a*. In other words, in the imaging part 60, the first imaging unit 61 and the second imaging unit 62 are fixed to the common housing 60*a*. The first imaging unit 61 is disposed at the lower portion of the housing 60*a*, and the second imaging unit 62 is disposed at the upper portion of the housing 60*a*.

The first imaging unit 61 recognizes the wafer W placed on the chuck top 70. Specifically, the first imaging unit 61 images the wafer W in order to recognize the wafer W placed on the chuck top 70.

The second imaging unit 62 recognizes the probes 91 of the probe card 90.

Specifically, the second imaging unit 62 images the probes 91 in order to recognize the probes 91 of the probe card 90.

Each of the first imaging unit 61 and the second imaging unit 62 has a camera including an optical system such as lenses and a light receiving device (specifically, photoelectric conversion device).

In the imaging part 60, the first imaging unit 61 and the second imaging unit 62 are provided on the same axis. Specifically, optical axes P1 and P2 of the camera of the first imaging unit 61 and the camera of the second imaging unit 62 are coaxial.

The imaging part 60 is controlled by the controller 22. The imaging result obtained by the imaging part 60 is outputted to the controller 22.

The imaging part 60 is configured to move in the horizontal direction (XY directions in FIG. 5 or the like) and the vertical direction (Z direction in FIG. 5 or the like) by an imaging moving mechanism 100 (see FIG. 8). Specifically, the housing 60*a* of the imaging part 60 is configured to move in the horizontal direction and the vertical direction by the imaging moving mechanism 100. The imaging moving mechanism 100 will be described later.

As shown in FIG. 7, the tester 40 has a tester motherboard 41 at a bottom portion thereof. A plurality of inspection circuit boards (not shown) are attached in an upright state to the tester motherboard 41. A plurality of electrodes (not shown) are provided on the bottom surface of the tester motherboard 41.

The pogo frame 80 is disposed under the tester 40.

The pogo frame 80 is an example of a holder, and holds the probe card 90. The pogo frame 80 electrically connects the probe card 90 and the tester 40. The pogo frame 80 has pogo pins 81 for the electrical connection described above, and more specifically, has a pogo block 82 for holding a number of pogo pins 81.

The probe card 90 is fixed to the bottom surface of the pogo frame 80 while being aligned at a predetermined position.

The tester motherboard 41 is vacuum-attracted to the pogo frame 80 by an exhaust mechanism (not shown), and the probe card 90 is vacuum-attracted to the pogo frame 80. Due to the vacuum suction force for performing the vacuum attraction, the lower ends of the pogo pins 81 of the pogo frame 80 are brought into contact with corresponding electrodes on the upper surface of a card body 92 (to be described later) of the probe card 90, and the upper ends of the pogo pins 81 are pressed against corresponding electrodes on the bottom surface of the tester motherboard 41.

The probe card 90 has a disc-shaped card body 92 having a plurality of electrodes on the upper surface thereof. The plurality of probes 91 that are needle-shaped contact terminals extending downward are disposed on the bottom surface of the card body 92.

The above-described plurality of electrodes disposed on the upper surface of the card body 92 are electrically connected to the corresponding probes 91. During the inspection, the probes 91 are brought into contact with electrodes (not shown) of the semiconductor devices formed on the wafer W. Therefore, during the electrical characteristic inspection, the electrical signal for the inspection is transmitted between the tester motherboard 41 and the semiconductor devices on the wafer W via the pogo pins 81, the electrodes disposed on the upper surface of the card body 92, and the probes 91.

In the inspection device 1, a large number of probes 91 cover substantially the entire bottom surface of the card body 92 in order to collectively inspect electrical characteristics of the plurality of semiconductor devices formed on the wafer W.

A bellows 83 is attached to the bottom surface of the pogo frame 80. The bellows 83 is a cylindrical extensible/contractible member that is suspended to surround the probe card 90. As indicate by the dotted line in FIG. 7, the bellows 83 attracts and holds the chuck top 70 at a position below the probe card 90.

The bellows 83 vacuum-attracts the chuck top 70, thereby forming a sealed space S surrounded by the pogo frame 80 including the probe card 90, the bellows 83, and the chuck top 70. The contact state between the wafer W and the probes 91 can be maintained by depressurizing the sealed space S with a depressurization mechanism (not shown).

The pogo frame 80 is provided with the correction target 84. The correction target 84 is used for determining a contact position. The contact position is the position of the chuck top 70 in the horizontal direction (X direction and Y direction in FIG. 5 or the like) at the time of bringing the wafer W supported by the chuck top 70 into contact with the probes 91.

The height of the correction target 84 is a height at which the wafer W placed on the chuck top 70 is close to but is not in contact with the probes 91 of the probe card 90 when the chuck top 70 is lifted together with the aligner-side imaging unit 54 so that the focus of the aligner-side imaging unit 54 is aligned with the correction target 84.

The horizontal position of the correction target 84 is the following position, for example. In other words, it is the position where the entire wafer W placed on the chuck top 70 overlaps the probes 91 in plan view when the chuck top 70 is moved together with the aligner-side imaging unit 54 such that the horizontal position of the aligner-side imaging unit 54 is located directly below the target. The position directly below the target position in the aligner-side imaging unit 54 is the position where the optical axis of the aligner-side imaging unit 54 and the correction target 84 (specifically, its center) coincide with each other.

As described above, the housing 60*a* of the imaging part 60 is configured to move in the horizontal direction and the vertical direction by the imaging moving mechanism 100 of FIG. 8.

The imaging moving mechanism 100 has a pair of guide rails 101 and a pair of moving rails 102.

The guide rails 101 are disposed to extend along the horizontal direction (X direction FIG. 8). In one embodiment, the guide rails 101 are provided to connect the partition wall 10*a* that partitions the divided areas 13*a* of the same height and the sidewall of the housing 10 of the inspection device 1. Further, the pair of guide rails 101 are spaced apart from each other so that the chuck top 70 can pass through the space between the guide rails 101.

The pair of moving rails 102 are provided to extend in a horizontal direction, which is perpendicular to the guide rails 101 (Y direction in FIG. 8), and are configured to move along the guide rail 101 while supporting the housing 60*a* of the imaging part 60. A driving part (not shown) for driving the movement is provided for the pair of moving rails 102. The driving part has, e.g., a motor as a driving source that generates a driving force for the movement. Further, a position detection mechanism (not shown) for detecting the position of the pair of moving rails 102 in the X direction, i.e., the position of the housing 60*a* of the imaging part 60 in the X direction, is provided for the pair of moving rails 102. The position detection mechanism is, e.g., a linear encoder.

Further, the pair of moving rails 102 support the housing 60*a* of the imaging part 60 to be movable along the extension direction of the moving rails 102 (Y direction in FIG. 8) and the vertical direction (Z direction in FIG. 8). A driving part (not shown) for driving the movement in the extension direction of the moving rails 102 and in the vertical direction is disposed between the housing 60*a* of the imaging part 60 and the pair of moving rails 102. The driving part has, e.g., a motor as a driving source that generates a driving force for the movement. Further, a position detection mechanism (not shown) for detecting the position of the housing 60*a* in the extension direction of the moving rails 102 and in the vertical direction is provided for the housing 60*a* of the imaging part 60. The position detection mechanism is, e.g., a linear encoder.

The imaging moving mechanism 100 is controlled by the controller 22. Specifically, the driving part for the moving rails 102 and the housing 60*a* is controlled by the controller 22. Further, the position detection result obtained by the position detection mechanism disposed at the moving rails 102 and the housing 60*a* is outputted to the controller 22.

Example 1 of Inspection Process Using Inspection Device 1

Figure 9:
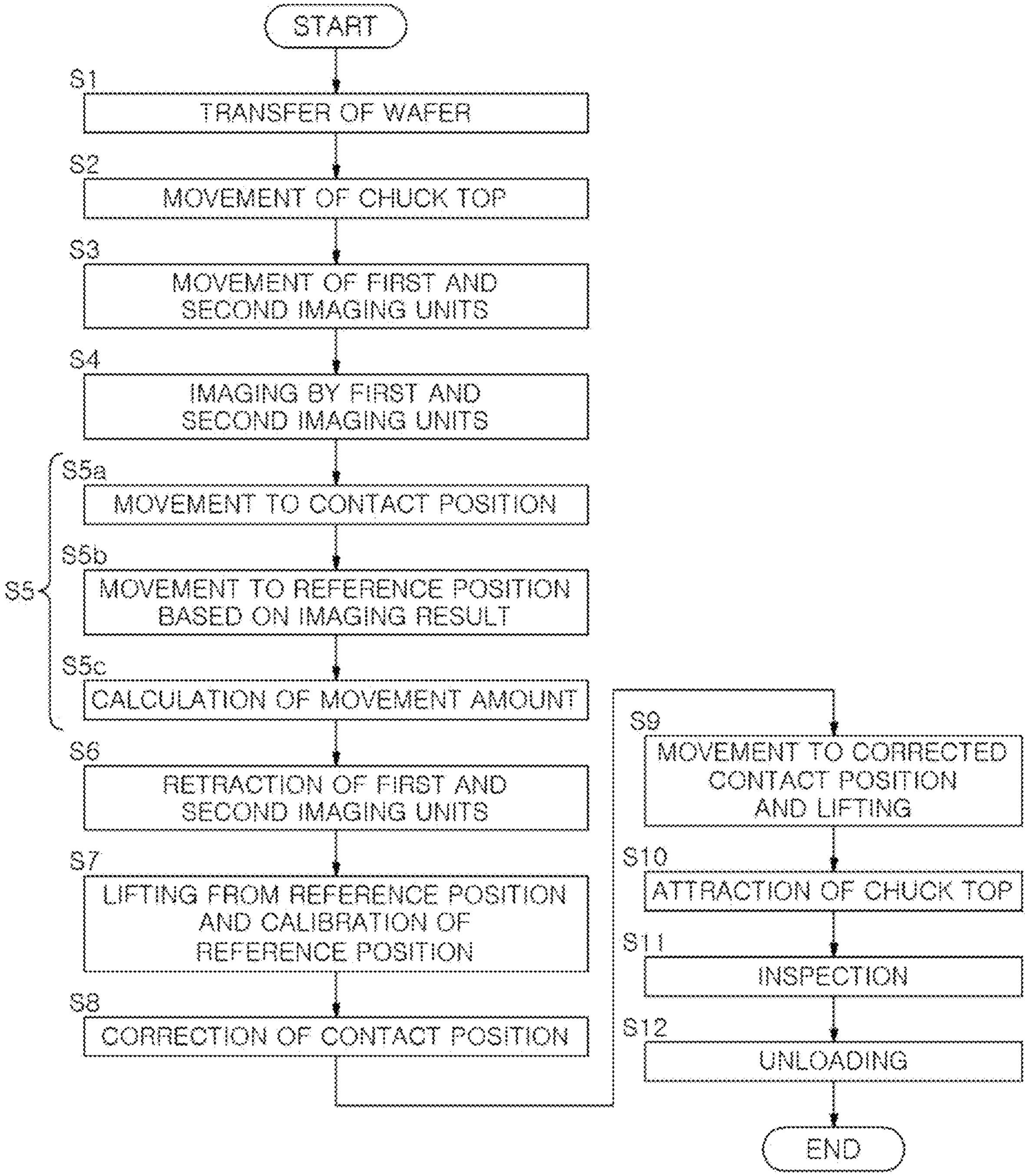
FIG. 9 is a flowchart showing Example 1 of an inspection process including a contact position determining process according to the present embodiment.
Figure 10:
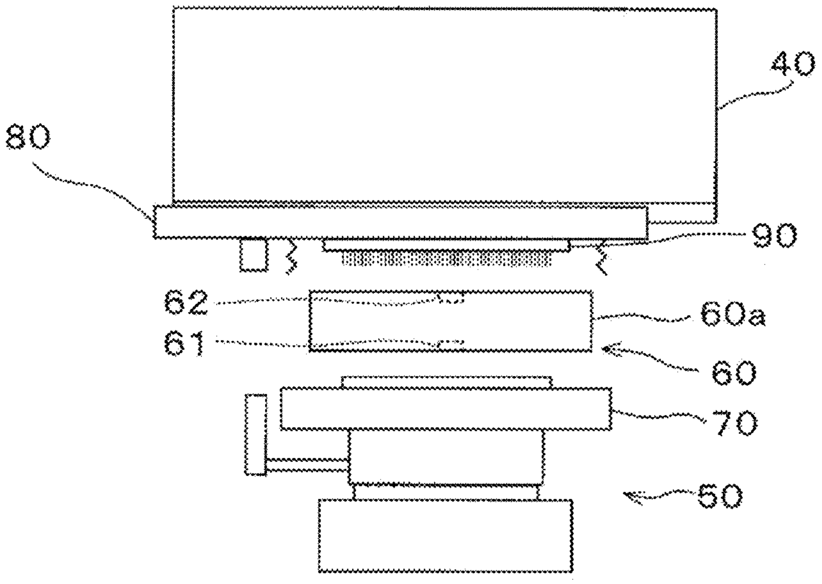
FIG. 10 explains Example 1 of the inspection process.
Figure 11:
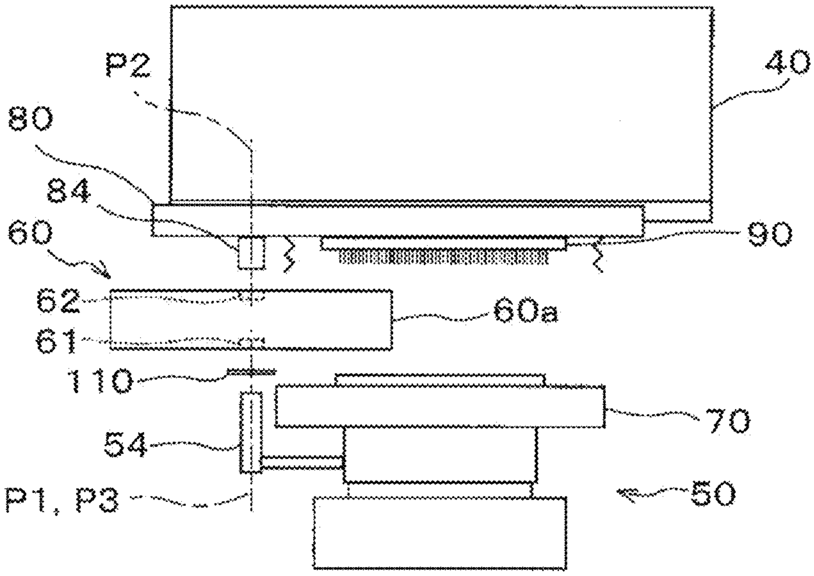
FIG. 11 explains Example 1 of the inspection process.
Figure 12:
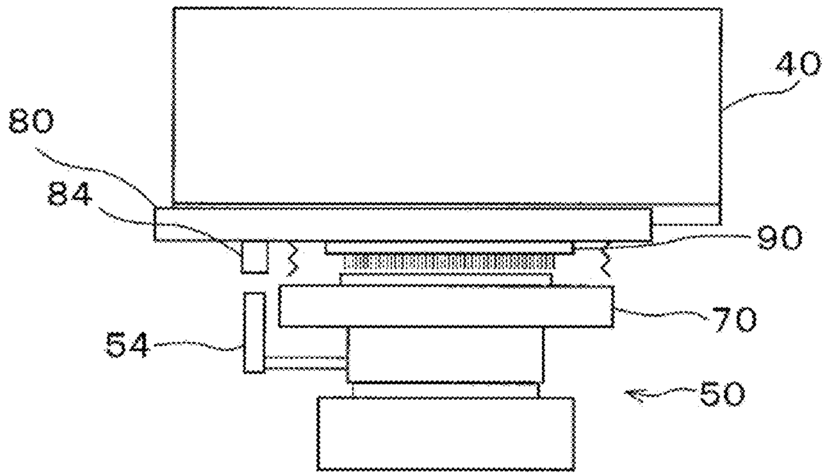
FIG. 12 explains Example 1 of the inspection process.

Next, an example of an inspection process including a contact position determining process using the inspection device 1 will be described with reference to FIGS. 9 to 12. FIG. 9 is a flowchart showing Example 1 of the inspection process. FIGS. 10 to 12 explain Example 1 of the inspection process.

(Step S1: Transfer)

First, as shown in FIG. 9, the wafer W to be inspected is transferred to the desired tester 40.

Specifically, the transfer device 30 and the like are controlled by the controller 22, and the wafer W is taken out of the cassette C in the port 20 of the loading/unloading area 11. The wafer W is transferred into the upper divided area 13*a*, for example, and is placed on the chuck top 70 attracted and held by the aligner 50 corresponding to the desired tester 40.

(Step S2: Movement of Chuck Top 70)

Next, as shown in FIG. 10, the chuck top 70 on which the wafer W is placed is moved to a position below the probe card 90.

Specifically, the aligner 50 is controlled by the controller 22, and the chuck top 70 on which the wafer W is placed is moved to a predetermined temporary contact position. If the chuck top 70 is set as the temporary contact position, all the probes 91 of the probe card 90 overlap the wafer W placed on the chuck top 70 in plan view, for example.

(Step S3: Movement of First Imaging Unit 61 and Second Imaging Unit 62)

Further, the first imaging unit 61 and the second imaging unit 62 are moved to a position between the probe card 90 and the chuck top 70 disposed below the probe card 90.

Specifically, the imaging moving mechanism 100 is controlled by the controller 22, and the housing 60*a* of the imaging part 60 is moved to the above-described position.

The order of steps S2 and S3 may vary, and steps S2 and S3 may be performed simultaneously.

(Step S4: Imaging)

Next, the first imaging unit 61 images the wafer W placed on the chuck top 70, and the second imaging unit 62 images the probes 91 of the probe card 90 through the gap between the probe card 90 and the chuck top 70. In other words, the controller 22 acquires the representative position of the wafer W using the first imaging unit 61 located between the probe card 90 and the chuck top 70, and acquires the representative position of the probes 91 using the second imaging unit 62 located between the probe card 90 and the chuck top 70.

Specifically, the representative position of the wafer W is acquired based on the imaging result of the first imaging unit 61 and the detection result of the position detection mechanism of the imaging moving mechanism 100.

The representative position of the wafer W is, e.g., the center of gravity position of the electrodes disposed at multiple predetermined locations on the wafer W. The position (specifically, position coordinates) of each electrode can be obtained based on the output from the position detection mechanism of the imaging moving mechanism 100 that is obtained when the center of the electrode is located at the center of the image obtained by the first imaging unit 61, for example.

The representative position of the probes 91 is obtained based on the imaging result of the second imaging unit 62 and the detection result of the position detection mechanism of the imaging moving mechanism 100.

The representative position of the probes 91 is, e.g., the center of gravity position of the probes 91 at multiple predetermined positions on the probe card 90. The position (specifically, position coordinates) of each probes 91 can be obtained based on the output from the position detection mechanism of the imaging moving mechanism 100 when the tip end of the probe 91 is located at the center of the image obtained by the second imaging unit 62.

(Step S5: Movement of the Chuck Top 70 to Reference Position)

Then, the chuck top 70 is moved such that the horizontal position thereof becomes the reference position. In other words, the chuck top 70 is moved to the horizontal reference position. The reference position is a position where the horizontal position of the aligner-side imaging unit 54 becomes a predetermined position with respect to the correction target 84, and the predetermined position is a position directly below the target, for example.

(Step S5*a*: Movement to Contact Position)

In step S5, first, the chuck top 70 is moved to a contact position calculated based on the representative position of the wafer W placed on the chuck top 70 and the representative position of the probes 91, for example. In other words, the wafer W placed on the chuck top 70 and the probes 91 of the probe card 90 are aligned.

Specifically, the controller 22 corrects the temporary contact position based on the imaging results obtained by the first imaging unit 61 and the second imaging unit 62, and the corrected temporary contact position is determined as the contact position. Then, the controller 22 controls the aligner 50 to move the chuck top 70 to the determined contact position.

The correction of the temporary contact position is performed based on the representative position of the wafer W and the representative position of the probes 91 acquired in step S4, for example. More specifically, the temporary contact position is corrected to offset the positional deviation of the representative position of the wafer W from the representative position of the probes 91.

(Step S5*b*: Movement to Reference Position Based on Imaging Results)

Then, based on the imaging results of the first imaging unit 61 and the second imaging unit 62, the chuck top 70 is moved, and the horizontal position thereof is set as the reference position.

Specifically, based on the imaging result of the second imaging unit 62, the controller 22 controls the imaging moving mechanism 100. First, as shown in FIG. 11, the housing 60*a* of the imaging part 60 is moved such that the optical axis P2 of the camera of the second imaging unit 62 and the correction target 84 coincide with each other. This movement is performed such that that the center of the correction target 84 is located at the center of the image obtained by the second imaging unit 62, for example.

Then, based on the imaging result of the first imaging unit 61, the controller 22 controls the aligner 50, and the chuck top 70 is moved such that the aligner-side imaging unit 54 and the first imaging unit 61 become coaxial.

More specifically, above the aligner-side imaging unit 54, the projection target 110 is moved or projected to a position where it is focused with the aligner-side imaging unit 54 (i.e., a position where the optical axis P3 of the camera of the aligner-side imaging unit 54 coincides with the center of the projection target 110) under the control of the controller 22. Then, based on the imaging result of the projection target 110 by the first imaging unit 61, the controller 22 controls the aligner 50, and the chuck top 70, the aligner-side imaging unit 54, and the projection target 110 are moved such that the optical axis P1 of the camera of the first imaging unit 61 coincides with the projection target 110. This movement is performed such that the center of the projection target 110 coincides with the center of the image obtained by the first imaging unit 61, for example.

Accordingly, the horizontal position of the chuck top 70 becomes the reference position, and the horizontal position of the aligner-side imaging unit 54 becomes the position directly below the target.

(Step S5*c*: Calculation of Movement Amount)

Then, the controller 22 calculates the movement amount of the chuck top 70 from the contact position to the reference position. The movement amount is the horizontal movement amount, and is calculated, based on the output from the position detection mechanism of the aligner 50, for example.

(Step S6: Retraction of First Imaging Unit 61 and Second Imaging Unit 62)

After step S5, the first imaging unit 61 and the second imaging unit 62 are retracted from the area between the probe card 90 and the chuck top 70. Specifically, the imaging moving mechanism 100 is controlled by the controller 22, and portions that may interfere with the chuck top 70 of the imaging moving mechanism 100 and the housing 60*a* of the imaging part 60 to which the first imaging unit 61 and the second imaging unit 62 are fixed are retracted to the area between adjacent chuck tops 70 in the same divided area 13*a*.

Step S6 may be performed before step S5*c*, or steps S6 and S5*c* may be performed simultaneously.

(Step S7: Lifting of Chuck Top 70 and Calibration of the Reference Position)

Then, the chuck top 70 is lifted from the reference position, and the aligner-side imaging unit 54 images the correction target 84. The reference position is calibrated based on the image of the correction target 84 that is obtained by the aligner-side imaging unit 54.

Specifically, first, the controller 22 controls the aligner 50, and the chuck top 70 is lifted from the reference position to the focal height as shown in FIG. 12. At the focal height, the aligner-side imaging unit 54 that is lifted together with the chuck top 70 is focused on the correction target 84. Then, the aligner-side imaging unit 54 images the correction target 84.

If the lifting direction of the chuck top 70 and the aligner-side imaging unit 54 is appropriate and perpendicular to the correction target 84, the horizontal position of the aligner-side imaging unit 54 is not changed before and after the chuck top 70 is lifted to the focal height, and is located directly below the target. However, due to distortion of the housing 10 where the aligner 50 is installed, the lifting direction of the chuck top 70 and the aligner-side imaging unit 54 may be tilted without being perpendicular to the correction target 84. In this case, during the lifting of the chuck top 70 and the aligner-side imaging unit 54, the horizontal position of the aligner-side imaging unit 54 is gradually shifted from the position directly below the target. This indicates that as the chuck top 70 and the aligner-side imaging unit 54 are lifted, the horizontal reference position of the chuck top 70 is shifted with respect to the probe card 90 fixed to the pogo frame 80 provided with the correction target 84 is provided.

Therefore, in the present embodiment, the reference position of the chuck top 70 at the focal height is calibrated as follows.

In other words, based on the imaging result of the correction target 84 by the aligner-side imaging unit 54, the aligner 50 is controlled by the controller 22, and the chuck top 70 is moved such that the horizontal position of the aligner-side imaging unit 54 becomes directly below the target. This movement is performed such that the center of the correction target 84 is located at the center of the image obtained by the aligner-side imaging unit 54. Then, the controller 22 calculates the horizontal position of the chuck top 70 after the movement based on the output from the position detection mechanism of the aligner 50, and obtains it as the reference position after the calibration of the chuck top 70 at the focal height.

Accordingly, the reference position of the chuck top 70 before it is lifted to the focal height and the calibrated reference position of the chuck top 70 at the focal height are substantially the same with respect to the probe card 90 fixed to the pogo frame 80. In other words, the reference position is calibrated based on the horizontal misalignment of the reference position of the chuck top 70 during the lifting to the focal height, thereby eliminating the misalignment.

(Step S8: Correction of Contact Position)

Then, the controller 22 corrects the contact position calculated from the imaging results obtained by the first imaging unit 61 and the second imaging unit 62 in step S4 based on the imaging result obtained by the aligner-side imaging unit 54 in step S5. Specifically, the controller 22 corrects the contact position determined in step S5 based on the calibrated reference position, for example.

More specifically, the controller 22 calculates the corrected contact position based on the following equations from the calibrated reference position of the chuck top 70 at the focal height acquired in step S7 and the amount of movement of the chuck top 70 from the contact position to the reference position calculated in step S5*c*.

$$X2 = X1 - dx$$

$$Y2 = Y1 - dy$$

X1: X coordinate of the calibrated reference position of the chuck top 70 at the focal height Y1: Y coordinate of the calibrated reference position of the chuck top 70 at the focal height dx: the amount of movement of the chuck top 70 in the +X direction from the contact position (before correction) to the reference position (before calibration)

dy: the amount of movement of the chuck top 70 in the +Y direction from the contact position (before correction) to the reference position (before calibration)

X2: X coordinate of the contact position after correction

Y2: Y coordinate of the contact position after correction

In steps S7 and S8, the calibration of the reference position of the chuck top 70 and the correction of the contact position based on the calibrated reference position may also be performed in the direction around the Z axis.

(Step S9: Movement to Corrected Contact Position and Lifting)

Then, the controller 22 controls the aligner 50, and the chuck top 70 is moved to the corrected contact position and then lifted. The lifting continues until the wafer W and the probes 91 are brought into contact with each other.

In this case, the reference height of the chuck top 70, which determines the height to which the chuck top 70 is lifted, is determined as follows, for example.

In other words, for example, when the representative position of the wafer W is obtained in step S4, the height of the wafer W placed on the chuck top 70 (specifically, the height of the electrodes) and the height of the probes 91 are also obtained, and the controller 22 determines the reference height of the chuck top 70 from these heights.

The height of the wafer W placed on the chuck top 70 is obtained based on the imaging result of the first imaging unit 61 and the detection result of the vertical position of the imaging moving mechanism 100 by the position detection mechanism.

The height of the probes 91 is obtained based on the imaging result of the second imaging unit 62 and the detection result of the vertical position of the imaging moving mechanism 100 by the position detection mechanism.

(Step S10: Attraction of Chuck Top 70)

Then, under the control of the controller 22, the chuck top 70 is attracted to the pogo frame 80.

Specifically, in a state where the wafer W and the probes 91 are in contact with each other, a depressurization mechanism (not shown) or the like is controlled and the Z stage 53 of the aligner 50 is lowered. Accordingly, the chuck top 70 is separated from the aligner 50 and attracted to the pogo frame 80.

(Step S11: Inspection)

After the chuck top 70 and the aligner 50 are separated, the electrical characteristic inspection of the electronic devices formed on the wafer W is performed.

The electrical signal for the electrical characteristic inspection is inputted from the tester 40 to the electronic devices via the pogo pins 81, the probes 91, and the like.

(Step S12: Unloading)

Then, the inspected wafer W is unloaded.

Specifically, the chuck top 70 that was attached to the pogo frame 80 is transferred to and held by the aligner 50. The inspected wafer W on the chuck top 70 held by the aligner 50 is unloaded from the inspection area 13 and returned to the cassette C in the port 20 of the loading/unloading area 11 by the transfer device 30.

During the inspection in one tester 40, the aligner 50 transfers the wafer W to be inspected to another tester 40 or collects the inspected wafer W from another tester 40.

Main Effects of Present Embodiment

In the embodiment described with reference to FIGS. 1 and 2 (hereinafter, referred to as "comparative embodiment"), the imaging result of the wafer W is used for alignment between the wafer W on the chuck top 503 in the inspection device 500 and the probes 501*a* of the probe card 501, as in the present embodiment. However, in the comparative embodiment, unlike the present embodiment, when the wafer W is imaged, the chuck top 503 is located in an area that does not overlap the probe card 501 in plan view, which is distant from the contact position below the probe card 501. Therefore, if the frame where the aligner 504 is installed is distorted, in the comparative embodiment, the wafer W and the probe 501*a* may not be aligned accurately based on the imaging result of the wafer W. On the other hand, in the present embodiment, when the wafer W on the chuck top 70 is imaged, the chuck top 70 is located at the contact position below the probe card 90. Hence, even if distortion occurs in the housing 10 where the aligner 50 is installed, the wafer W can be brought into contact with the probes 91 more appropriately, compared to the comparative embodiment. In other words, in accordance with the present embodiment, the alignment between the wafer W and the probes 91 of the probe card 90 can be more accurately performed. The distortion of the housing 10 may occur on the order of μm due to expansion or contraction caused by changes in the temperature of the housing 10, or changes in the center of gravity of the multiple aligners 50 in the housing 10, for example.

In the present embodiment, when the chuck top 70 is lifted from the reference position, first, the correction target 84 is imaged by the aligner-side imaging unit 54, and the horizontal reference position of the chuck top 70 is calibrated based on the imaging result. Accordingly, the uncalibrated reference position at the height before the chuck top 70 is lifted and the calibrated reference position at the height after the chuck top 70 is lifted (specifically, the focal height) are substantially the same with respect to the probe card 90 fixed to the pogo frame 80. Therefore, the contact position before correction based on the uncalibrated reference position at the height before the lifting and the contact position after correction based on the calibrated reference position at the height after the lifting are substantially the same with respect to the probe card 90 fixed to the pogo frame 80. Since the horizontal misalignment of the chuck top 70 during the lifting of the chuck top 70 is considered, the alignment between the wafer W and the probes 91 of the probe card 90 can be performed more accurately in the present embodiment.

Example 2 of Inspection Process Using Inspection Device 1

Figure 13:
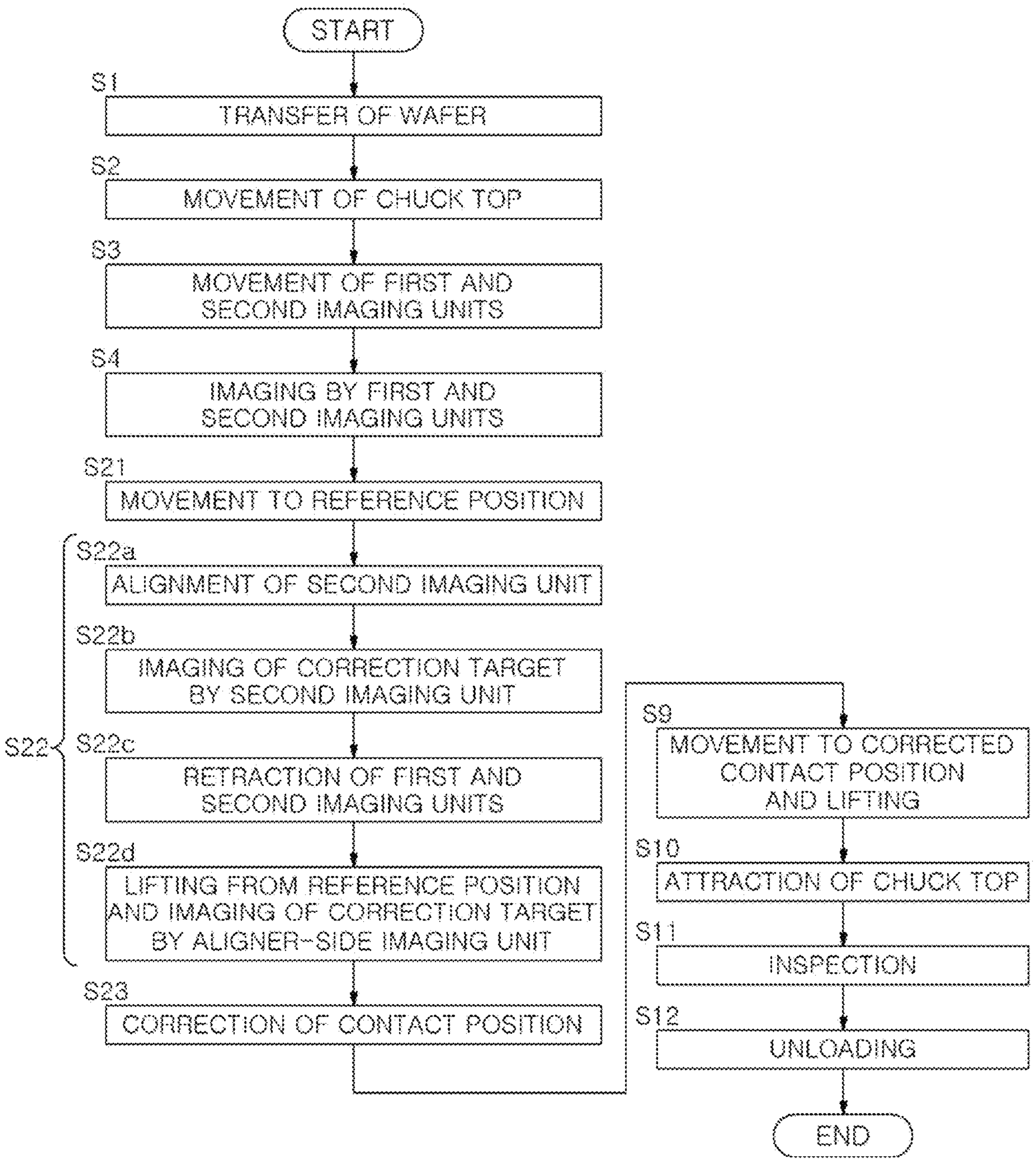
FIG. 13 is a flowchart showing Example 2 of the inspection process including the contact position determining process.

FIG. 13 is a flowchart showing Example 2 of the inspection process including a contact position determining process using the inspection device 1.

In Example 2 of the inspection process, steps S1 to S4 are performed in the same manner as that in Example 1 of the inspection process.

(Step S21: Movement to Contact Position as Reference Position)

In Example 2 of the inspection process, subsequent to step S4, the chuck top 70 is moved to the horizontal reference position (step S21), similarly to Example 1 of inspection process. However, in this example, unlike Example 1 of inspection process, the reference position is a contact position calculated from the imaging results obtained by the first imaging unit 61 and the second imaging unit 62 in step S4, specifically, a contact position calculated based on the representative position of the wafer W and the representative position of the probes 91 acquired in step S4.

(Step S22: Lifting of Chuck Top 70 and Imaging of Correction Target 84)

Next, similarly to step S7 of Example 1 of the inspection process, the chuck top 70 is lifted from the reference position, and the correction target 84 is imaged by the aligner-side imaging unit 54.

(Step S22*a*: Alignment of Second Imaging Unit 62)

However, in step S22, unlike the above-described step S7, for example, first, before the chuck top 70 is lifted from the reference position, the controller 22 controls the imaging moving mechanism 100, and the housing 60*a* of the imaging part 60 is moved such that the first imaging unit 61 and the aligner-side imaging unit 54 become coaxial. In other words, the alignment of the second imaging unit 62 that is moved together with the housing 60*a* is performed.

Specifically, under the control of the controller 22, the projection target 110 is advanced to a position above the aligner-side imaging unit 54 where it is focused with the aligner-side imaging unit 54. Then, based on the imaging result of the projection target 110 by the first imaging unit 61, the controller 22 controls the imaging moving mechanism 100 to move the housing 60*a* of the imaging part 60 such that the optical axis P1 of the camera of the first imaging unit 61 coincides with the projection target 110. This movement is performed such that the center of the projection target 110 is located at the center of the image obtained by the first imaging unit 61, for example.

(Step S22*b*: Imaging of Correction Target 84 by Second Imaging Unit 62)

Then, the correction target 84 is imaged by the aligned second imaging unit 62.

Specifically, in a state where the housing 60*a* of the imaging part 60 is moved to a position where the optical axis P1 of the camera of the first imaging unit 61 coincides with the projection target 110, the correction target 84 provided at the pogo frame 80 is imaged by the second imaging unit 62.

Figure 14:
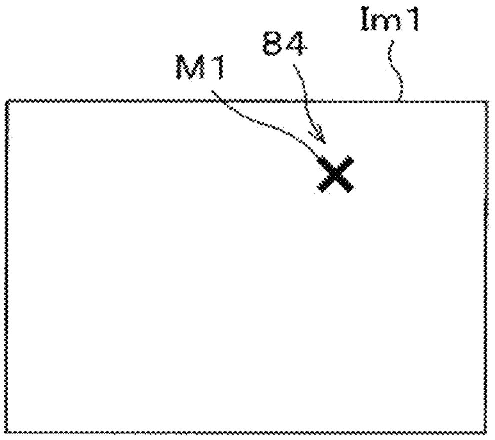
FIG. 14 shows an example of an image of a correction target imaged by a second imaging unit.

Accordingly, an image Im1 including a mark M1 of the correction target 84 as shown in FIG. 14 is obtained.

(Step S22c: Retraction of First Imaging Unit 61 and Second Imaging Unit 62)

Next, similarly to step S6 of Example 1 of the inspection process, the first imaging unit 61 and the second imaging unit 62 are retracted from the area between the probe card 90 and the chuck top 70.

(Step S22d: Lifting of the Chuck Top 70 and Imaging of Correction Target 84)

Then, the chuck top 70 is lifted from the reference position, and the correction target 84 is imaged by the aligner-side imaging unit 54.

Figure 15:
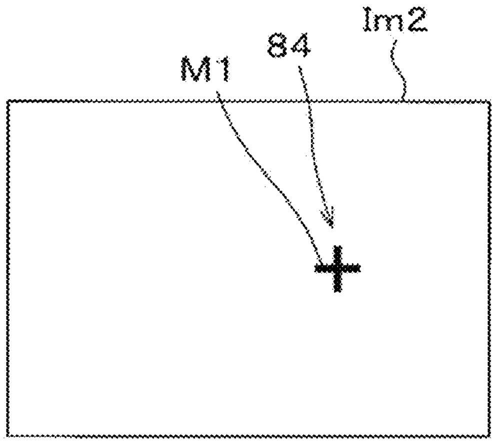
FIG. 15 shows an example of an image of a correction target imaged by an aligner-side imaging unit.

Specifically, first, the controller 22 controls the aligner 50, and the chuck top 70 is lifted from the reference position to the focal height. Then, the correction target 84 is imaged by the aligner-side imaging unit 54. Accordingly, an image Im2 including the mark M1 of the correction target 84 as shown in FIG. 15 is obtained.

(Step S23: Correction of Contact Position)

Then, the controller 22 corrects the contact position calculated from the imaging results obtained by the first imaging unit 61 and the second imaging unit 62 in step S4 based on the imaging results of the correction target 84 by the second imaging unit 62 and the aligner-side imaging unit 54.

Specifically, the controller 22 corrects the contact position based on the imaging result of the correction target 84 by the second imaging unit 62 in step S22b and the imaging result of the correction target 84 by the aligner-side imaging unit 54 in step S22d.

More specifically, based on the imaging result of the correction target 84 by the second imaging unit 62 in step S22b and the imaging result of the correction target 84 by the aligner-side imaging unit 54 in step S22d, the controller 22 corrects the contact position such that both imaging results coincide with each other. In other words, based on the image Im1 of FIG. 14 and the image Im2 of FIG. 15, the controller 22 corrects the contact position in the X direction, the Y direction, and the direction around the Z axis such that the image of the correction target 84 obtained by the aligner-side imaging unit 54 after the correction coincides with the image Im1.

Then, similarly to step S9 in Example 1 of the inspection process, the controller 22 controls the aligner 50, and the chuck top 70 is moved to the corrected contact position and then lifted. The lifting is continued until the wafer W and the probes 91 are brought into contact with each other.

In a state where the chuck top 70 is located at the contact position after correction, the aligner-side imaging unit 54 may image the correction target 84 again, as in step S22d. Then, the degree of coincidence between the image of the correction target 84 by the second imaging unit 62 in step S22b and the image of the correction target 84 by the aligner-side imaging unit 54 may be determined. Specifically, it may be determined that the degree of misalignment of the position of the correction target 84 in the image obtained by the aligner-side imaging unit 54 with respect to the position of the correction target 84 in the image obtained by the second imaging unit 62 falls within a predetermined range. If the degree of coincidence is not sufficient, i.e., if the degree of misalignment does not fall within the predetermined range, the contact position may be corrected again until it falls within the predetermined range.

After the contact position is corrected, steps S10 to S12 are performed, similarly to Example 1 of the inspection process.

Main Effects of Present Embodiment

In Example 2 of the inspection process, similarly to Example 1 of the inspection process, the wafer W and the probes 91 of the probe card 90 can be aligned more accurately. In Example 2 of the inspection process, the horizontal misalignment of the chuck top 70 during the lifting of the chuck top 70 is considered, so that the wafer W and the probes 91 of the probe card 90 can be aligned more accurately.

Modification of Example 2 of Inspection Process Using Inspection Device 1

Figure 16:
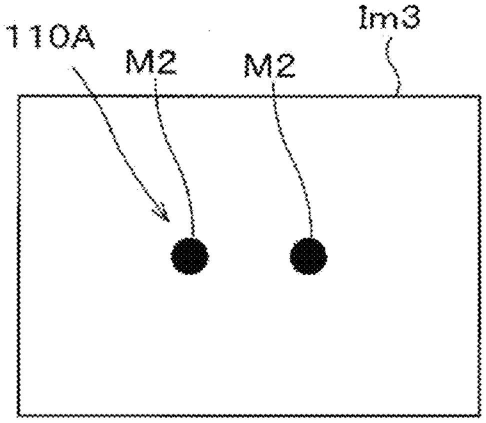
FIG. 16 shows an example of an angle discrimination target.

An angle discrimination target 110A illustrated in FIG. 16 may be used as a projection target for aligning the second imaging unit 62 in step S22a, i.e., a projection target for aligning the first imaging unit 61 and the aligner-side imaging unit 54. The angle discrimination target 110A can discriminate the angle (hereinafter, referred to as "relative angle of the aligner-side imaging unit 54") of the aligner-side imaging unit 54 with respect to the housing 60a of the imaging part 60 in top view, and has two marks M2 and M2 spaced apart from each other, for example. Specifically, the angle discrimination target 110A is formed such that a center of a line segment that connects the two marks M2 and M2 is located at the center of an image Im3 obtained by the aligner-side imaging unit 54 and the line segment is parallel to the horizontal direction in the image Im3.

Figure 17:
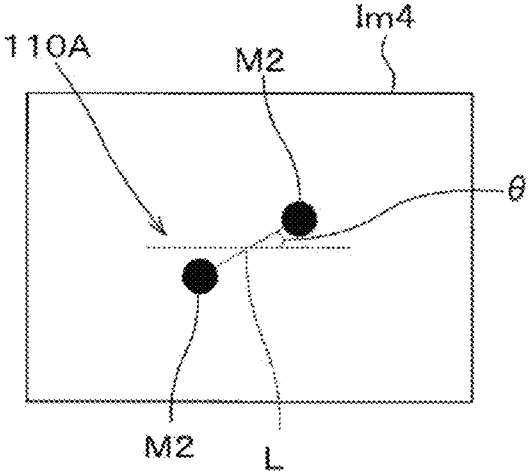
FIG. 17 shows an example of an image of the angle discrimination target imaged by the first imaging unit.

In the case of using the angle discrimination target 110A, when the first imaging unit 61 and the aligner-side imaging unit 54 become coaxial in step S22a, the housing 60a of the imaging part 60 is moved as follows. In other words, based on the imaging result of the angle discrimination target 110A by the first imaging unit 61, the controller 22 controls the imaging moving mechanism 100, and the housing 60a of the imaging part 60 is moved such that the optical axis P1 of the camera of the first imaging unit 61 coincides with the angle discrimination target 110A. This movement is performed such that the center of the line segment L that connects the two marks M2 and M2 is located at the center of an image Im4 obtained by the first imaging unit 61, as shown in FIG. 17.

In the case of using the angle discrimination target 110A, the first imaging unit 61 images the angle discrimination target 110A in a state where the first imaging unit 61 and the aligner-side imaging unit 54 are coaxial in step S22a.

Further, the controller 22 acquires the relative angle of the aligner-side imaging unit 54 based on the imaging result of the angle discrimination target 110A by the first imaging unit 61.

Specifically, the controller 22 calculates an angle θ of the line segment L from the image Im4 obtained by the first imaging unit 61 in a state where the first imaging unit 61 and the aligner-side imaging unit 54 are coaxial, and obtains it as the relative angle of the aligner-side imaging unit 54.

In the case of correcting the contact position in step S23, the controller 22 performs the correction based on the imaging results of the correction target 84 by the second imaging unit 62 and the aligner-side imaging unit 54 and the relative angle of the aligner-side imaging unit 54.

Specifically, the controller 22 corrects the imaging result of the correction target 84 by the second imaging unit 62 based on the above relative angle. Further, the controller 22 corrects the contact position such that the imaging result of the correction target 84 by the corrected second imaging unit 62 and the imaging result of the correction target 84 by the aligner-side imaging unit 54 coincide with each other.

In other words, the controller 22 corrects the above-described image Im1 in FIG. 14 to be tilted by the relative angle. Then, based on the corrected image Im1 and the image Im2 in FIG. 15, the controller 22 corrects the contact position in the X direction, the Y direction, and the direction around the Z axis such that the image of the correction target 84 obtained by the aligner-side imaging unit 54 after correction coincides with the corrected image Im1.

The controller 22 may correct the imaging result of the correction target 84 by the aligner-side imaging unit 54 based on the relative angle, and correct the contact position such that the imaging result of the correction target 84 by the corrected aligner-side imaging unit 54 coincided with the imaging result of the correction target 84 by the second imaging unit 62.

In accordance with the modification of Example 2 of the inspection process using the inspection device 1, the contact position is corrected in consideration of the relative angle of the aligner-side imaging unit 54, so that the alignment between the wafer W and the probes 91 of the probe card 90 can be performed more accurately.

Modification of Example 1 of Inspection Process Using Inspection Device 1

In the inspection process using the inspection device 1, similarly to the modification of Example 2 of the inspection process, the relative angle of the aligner-side imaging unit 54 may be obtained using the angle discrimination target 110A, and the contact position may be corrected using the relative angle.

Other Modifications

In the above examples, the first imaging unit 61 and the second imaging unit 62 are provided in the same housing, but they may be provided in separate housings. However, it is preferable that they are provided in the same housing because it is unnecessary to perform a process of associating the coordinate system based on the image obtained by the first imaging unit 61 with the coordinate system based on the image obtained by the second imaging unit 62.

In the above example, when the first imaging unit 61 and the second imaging unit 62 are provided in the same housing, the optical axis of the first imaging unit 61 and the optical axis of the second imaging unit 62 are aligned, but they may be misaligned. In that case, information on the positional relationship between the optical axis of the first imaging unit 61 and the optical axis of the second imaging unit 62 is also used to calibrate the reference position.

However, it is difficult to accurately recognize the positional relationship between the optical axis of the first imaging unit 61 and the optical axis of the second imaging unit 62 when they are misaligned, and the positional relationship changes due to distortion of the housing 10 caused by a temperature. Thus, when the first imaging unit 61 and the second imaging unit 62 are provided on the same axis, it is possible to more reliably obtain the appropriate contact position, i.e., to more reliably perform appropriate alignment.

Figure 18:
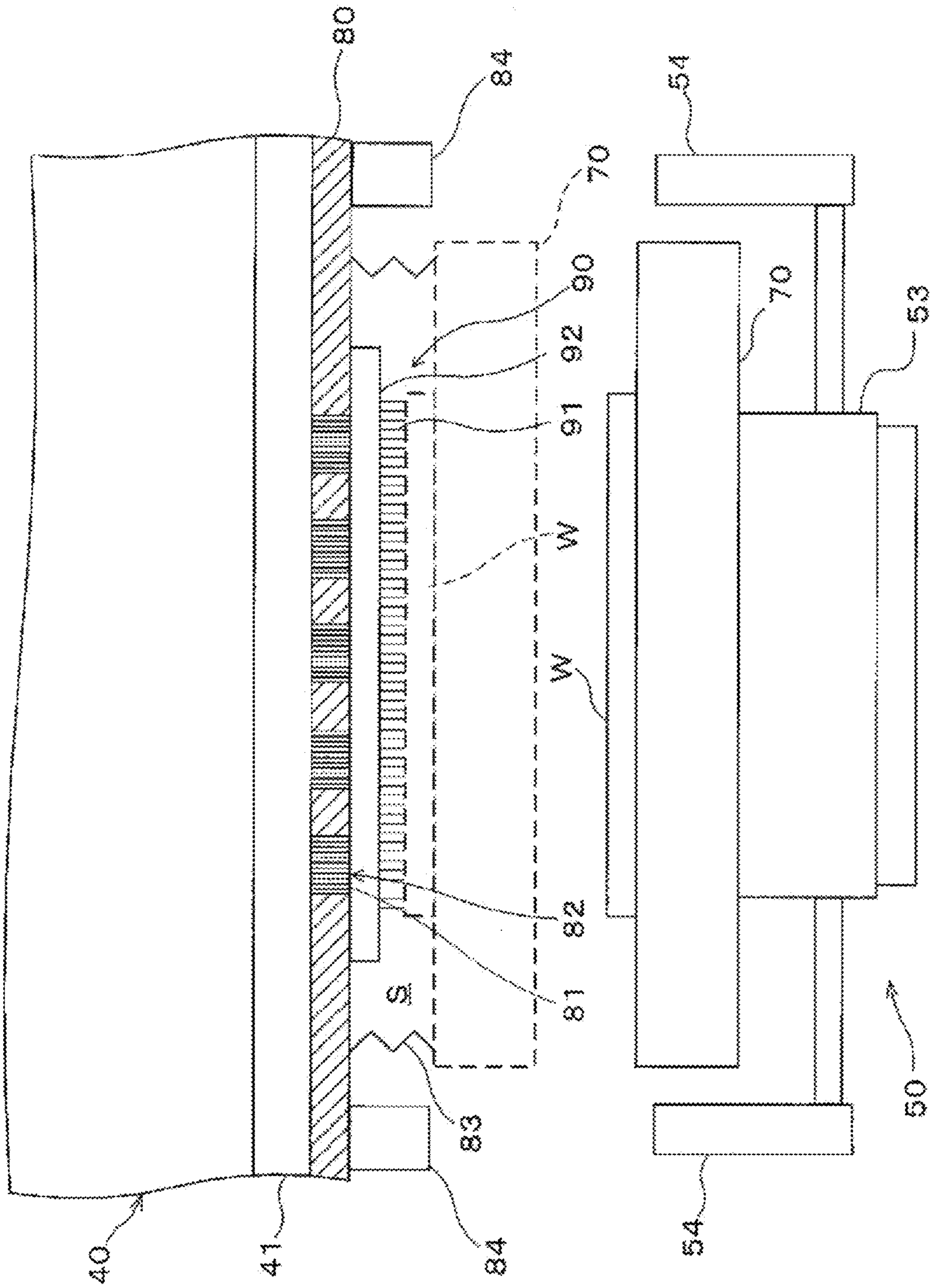
FIG. 18 shows another example of the aligner-side imaging unit.

In the above example, only one aligner-side imaging unit 54 and one correction target 84 are provided, but multiple aligner-side imaging units 54 (two in the illustrated example) and multiple correction targets 84 (two in the illustrated example) may be provided as shown in FIG. 18. Specifically, the plurality of aligner-side imaging units 54 and the plurality of correction targets 84 may be provided along the circumferential direction of the chuck top 70 and the probe card 90.

In this case, in the process in which the chuck top 70 is lifted from the reference position and the correction targets 84 is imaged by the aligner-side imaging units 54, each aligner-side imaging unit 54 images the corresponding correction target 84. Further, in the process in which the contact position is corrected based on the imaging results of the correction targets 84 by the aligner-side imaging units 54, the contact position is corrected based on the imaging results obtained by the multiple aligner-side imaging units 54.

Specifically, in the above-described Example 1 of the inspection process, when the chuck top 70 is moved to the reference position in step S5, each of the multiple aligner-side imaging units 54 is used. Then, when the reference position is calibrated in step S7, the corresponding correction target 84 is imaged by each of the aligner-side imaging units 54, and the above-described calibration is performed based on the imaging results.

Further, in Example 2 of the inspection process, in steps S22*a* and S22*b*, in each of the aligner-side imaging units 54, the alignment of the second imaging unit 62 and the imaging of the corresponding correction target 84 by the aligned second imaging unit 62 are performed. Further, in step S22*d*, the corresponding correction target 84 is imaged by each of the multiple aligner-side imaging units 54. Then, in step S23, in each of the aligner-side imaging units 54, the contact position is corrected such that the imaging result of the corresponding correction target 84 by the second imaging unit 62 in step S22*b* coincides with the imaging result of the corresponding correction target 84 in step S22*d*.

In the case of using the relative angle of the aligner-side imaging unit 54, the relative angle is acquired for each of the aligner-side imaging units 54. Further, in step S23, for each of the aligner-side imaging units 54, one of the imaging result in step S22*b* and the imaging result in step S22*d* is corrected based on the relative angle. Then, for each of the aligner-side imaging units 54, the contact position is corrected such that the corrected result coincides with the uncorrected result.

By providing the plurality of aligner-side imaging units 54 and the plurality of correction targets 84 as described above, the alignment between the wafer W and the probes 91 of the probe card 90 can be performed more accurately.

It should be noted that the above-described embodiments are illustrative in all respects and are not restrictive. The above-described embodiments may be omitted, replaced, or changed in various forms without departing from the scope of the appended claims and the gist thereof. For example, the components of the above-described embodiments can be randomly combined. The effects of the components for arbitrary combination can be obtained from the corresponding arbitrary combination, other effects apparent to those skilled in the art can also be obtained.

The effects described in the present specification are merely explanatory or exemplary, and are not restrictive. In other words, in the technique related to the present disclosure, other effects apparent to those skilled in the art can be obtained from the description of the present specification in addition to the above-described effects or instead of the above-described effects.

the following configuration examples are also included in the technical scope of the present disclosure.

(1) An inspection method for inspecting a substrate using an inspection device, comprising:

(A) moving a placing member on which a substrate is placed to a position below a probe card held by a holder;

(B) thereafter, imaging the substrate placed on the placing member by a first imaging unit and imaging probes of the probe card by a second imaging unit from a gap between the probe card and the placing member;

(C) moving the placing member to a reference position in a horizontal direction;

(D) lifting the placing member from the reference position and imaging a target provided at the holder by a third imaging unit that moves together with the placing member; and (E) correcting a contact position, which is calculated from imaging results obtained by the first imaging unit and the second imaging unit in said (B), based on an imaging result obtained by the third imaging unit in said (D).

(2) The inspection method of (1), wherein the reference position of the placing member is a position where a horizontal position of the third imaging unit becomes a predetermined position with respect to the target, and in said (D), the reference position is calibrated based on the imaging result of the target by the third imaging unit, and in said (E), the contact position is corrected based on the calibrated reference position.

(3) The inspection method (2), wherein the first imaging unit and the second imaging unit are fixed to a common housing, and said (C) includes:

moving the housing such that an optical axis of the second imaging unit coincides with the target;

thereafter, moving the placing member such that the third imaging unit and the first imaging unit become coaxial.

(4) The inspection method of (2) or (3), wherein the predetermined position is a position directly below the target where an optical axis of the third imaging unit coincides with the target.

(5) The inspection method of (4), wherein said (C) includes:

moving the placing member to the contact position and then to the reference position, and calculating the amount of movement of the placing member from the contact position to the reference position, said (D) includes:

lifting the placing member from the reference position to a focal height at which the third imaging unit is focused on the target, and moving the placing member such that the third imaging unit is positioned directly below the target in a state where the placing member is lifted to the focal height, and acquiring a position of the placing member after the movement as the calibrated reference position, and said (E) includes:

calculating a contact position after correction based on the calibrated reference position and the amount of movement of the placing member from the contact position to the reference position.

(6) The inspection method of (1), wherein the reference position of the placing member is the contact position before correction.

(7) The inspection method of (6), wherein the first imaging unit and the second imaging unit are fixed to a common housing, and said (D) includes:

moving the housing such that the first imaging unit and the third imaging unit become coaxial in a state where the placing member is moved to the contact position before correction;

thereafter, imaging the target by the second imaging unit in a state where the first imaging unit and the third imaging unit are coaxial;

thereafter, lifting the placing member from the contact position before correction and imaging the target by the third imaging unit, and in said (E), the contact position is corrected based on the imaging results of the target by the second imaging unit and the third imaging unit.

(8) The inspection method of (7), wherein in said (E), the contact position is corrected such that the imaging result of the target by the second imaging unit and the imaging result of the target by the third imaging unit coincide with each other.

(9) The inspection method of (7) or (8), wherein said moving the housing in said (D) includes moving the housing based on the imaging result of another target disposed between the first imaging unit and the third imaging unit by the first imaging unit, the inspection method further comprising:

acquiring an angle of the third imaging unit with respect to the housing in top view based on the imaging result of said another target by the first imaging unit, and in said (E), the contact position is corrected based on the imaging results obtained by the second imaging unit and the third imaging unit and the angle of the third imaging unit with respect to the housing in top view.

(10) The inspection method of (9), wherein in said (E), any one of the imaging results of said another target by the first imaging unit and the third imaging unit is corrected based on the angle of the third imaging unit with respect to the housing in the top view, and the contact position is corrected such that the corrected result coincides with the uncorrected result.

(11) The inspection method of (9) or (10), wherein said another target has two marks spaced apart from each other.

(12) The inspection method of any one of (1) to (11), wherein the inspection device has a plurality of the third imaging units, in said (D), each of the third imaging units images the corresponding target, in said (E), the contact position is corrected based on the imaging results obtained by the plurality of the third imaging units.

(13) An inspection device for inspecting a substrate, comprising:

a placing member on which the substrate is placed;

a holder configured to hold a probe card having probes to be in contact with electrodes on the substrate;

a first imaging unit configured to recognize the substrate placed on the placing member;

a second imaging unit configured to recognize the probes of the probe card held by the holder;

a target provided at the holder;

a third imaging unit configured to recognize the target;

a moving mechanism configured to detachably hold and move the placing member and move the third imaging unit together with the placing member;

an imaging moving mechanism configured to move the first imaging unit and the second imaging unit; and and a controller;

wherein the controller is configured to execute:

(A) moving the placing member on which the substrate is placed to a position below the probe card held by the holder;

(B) thereafter, imaging the substrate placed on the placing member by the first imaging unit and imaging the probes of the probe card by the second imaging unit from a gap between the probe card and the placing member;

(C) moving the placing member to a reference position in a horizontal direction;

(D) lifting the placing member from the reference position and imaging the target by the third imaging unit; and (E) correcting a contact position, which is calculated from positions of the probes based on imaging results obtained by the first imaging unit and the second imaging unit in said (B), based on an imaging result obtained by the third imaging unit in said (D).

(14) The inspection device of (13), wherein the reference position of the placing member is a position where a horizontal position of the third imaging unit is located at a predetermined position based on the target, in said (D), the reference position is calibrated based on the imaging result of the target by the third imaging unit, and in said (E), the contact position is corrected based on the calibrated reference position.

(15) The inspection device of (14), further comprising:

an imaging part having a common housing to which the first imaging unit and the second imaging unit are fixed, wherein the imaging moving mechanism moves the first imaging unit and the second imaging unit by moving the housing of the imaging part, and said (C) includes:

moving the housing such that the optical axis of the second imaging unit and the target coincide, moving the placing member such that the third imaging unit and the first imaging unit become coaxial.

(16) The inspection device of (14) or (15), wherein the predetermined position is a position directly below the target where an optical axis of the third imaging unit coincides with the target.

(17) The inspection device of (16), wherein said (C) includes:

moving the placing member to the contact position and then to the reference position, calculating the amount of movement of the placing member from the contact position to the reference position, said (D) includes:

lifting the placing member from the reference position to a focal height at which the third imaging unit is focused on the target, and moving the placing member such that the third imaging unit is positioned directly below the target in a state where the placing member is lifted to the focal height, and acquiring a position of the placing member after the movement as the calibrated reference position, and said (E) includes:

calculating a contact position after correction based on the calibrated reference position and the amount of movement of the placing member from the contact position to the reference position.

(18) The inspection device of (13), wherein the reference position of the placing member is the contact position before correction.

(19) The inspection device of (18), further comprising:

an imaging part having a common housing to which the first imaging unit and the second imaging unit are fixed, wherein the imaging moving mechanism moves the first imaging unit and the second imaging unit by moving the housing of the imaging part, said (D) includes:

moving the housing such that the first imaging unit and the third imaging unit become coaxial in a state where the placing member is moved to the contact position before correction, thereafter, imaging the target by the second imaging unit in a state where the first imaging unit and the third imaging unit are coaxial, thereafter, lifting the placing member from the contact position before correction and imaging the target by the third imaging unit, and in said (E), the contact position is corrected based on the imaging results of the target by the second imaging unit and the third imaging unit.

(20) The inspection device of (19), wherein in said (E), the contact position is corrected such that the imaging result of the target by the second imaging unit and the imaging result of the target by the third imaging unit coincide with each other.

(21) The inspection device of (19) or (20), wherein said moving the housing in said (D) includes moving the housing based on an imaging result of another target disposed between the first imaging unit and the third imaging unit by the first imaging unit, wherein the controller is configured to further execute acquiring an angle of the third imaging unit with respect to the housing in top view based on the imaging result of said another target by the first imaging unit, and in said (E), the contact position is corrected based on the imaging results obtained by the second imaging unit and the third imaging unit and the angle of the third imaging unit with respect to the housing in top view.

(22) The inspection device of (21), wherein in said (E), any one of the imaging results of said another target by the first imaging unit and the third imaging unit is corrected based on the angle of the third imaging unit with respect to the housing in top view, and the contact position is corrected such that the corrected result coincides with the uncorrected result.

(23) The inspection device of (21) or (22), wherein said another target has two marks spaced apart from each other.

(24) The inspection device of any one of (13) to (23), wherein the inspection device has a plurality of the third imaging units, in said (D), each of the third imaging units images the corresponding target, and in said (E), the contact position is corrected based on the imaging results obtained by the plurality of the third imaging units.

DESCRIPTION OF REFERENCE NUMERALS

1: inspection device
22: controller
50: aligner
54: aligner-side imaging unit
61: first imaging unit 62: second imaging unit
70: chuck top
80: pogo frame
84: correction target
90: probe card
91: probe
100: imaging moving mechanism
W: wafer

The invention claimed is:

1. An inspection method for inspecting a substrate using an inspection device, comprising:

(A) moving a placing member on which a substrate is placed to a position below a probe card held by a holder;

(B) thereafter, imaging the substrate placed on the placing member by a first imaging unit and imaging probes of the probe card by a second imaging unit from a gap between the probe card and the placing member;

(C) moving the placing member to a reference position in a horizontal direction;

(D) lifting the placing member from the reference position and imaging a target provided at the holder by a third imaging unit that moves together with the placing member; and (E) correcting a contact position, which is calculated from imaging results obtained by the first imaging unit and the second imaging unit in said (B), based on an imaging result obtained by the third imaging unit in said (D).

2. The inspection method of claim 1, wherein the reference position of the placing member is a position where a horizontal position of the third imaging unit becomes a predetermined position with respect to the target, and in said (D), the reference position is calibrated based on the imaging result of the target by the third imaging unit, and in said (E), the contact position is corrected based on the calibrated reference position.

3. The inspection method of claim 2, wherein the first imaging unit and the second imaging unit are fixed to a common housing, and said (C) includes:

moving the common housing such that an optical axis of the second imaging unit coincides with the target;

thereafter, moving the placing member such that the third imaging unit and the first imaging unit become coaxial.

4. The inspection method of claim 2, wherein the predetermined position is a position directly below the target where an optical axis of the third imaging unit coincides with the target.

5. The inspection method of claim 4, wherein said (C) includes:

moving the placing member to the contact position and then to the reference position, and calculating an amount of movement of the placing member from the contact position to the reference position, said (D) includes:

lifting the placing member from the reference position to a focal height at which the third imaging unit is focused on the target, and moving the placing member such that the third imaging unit is positioned directly below the target in a state where the placing member is lifted to the focal height, and acquiring a position of the placing member after the movement as the calibrated reference position, and said (E) includes:

calculating a contact position after correction based on the calibrated reference position and the amount of movement of the placing member from the contact position to the reference position.

6. The inspection method of claim 1, wherein the reference position of the placing member is the contact position before correction.

7. The inspection method of claim 6, wherein the first imaging unit and the second imaging unit are fixed to a common housing, and said (D) includes:

moving the common housing such that the first imaging unit and the third imaging unit become coaxial in a state where the placing member is moved to the contact position before correction;

thereafter, imaging the target by the second imaging unit in a state where the first imaging unit and the third imaging unit are coaxial;

thereafter, lifting the placing member from the contact position before correction and imaging the target by the third imaging unit, and in said (E), the contact position is corrected based on the imaging results of the target by the second imaging unit and the third imaging unit.

8. The inspection method of claim 7, wherein in said (E), the contact position is corrected such that the imaging result of the target by the second imaging unit and the imaging result of the target by the third imaging unit coincide with each other.

9. The inspection method of claim 7, wherein said moving the common housing in said (D) includes moving the common housing based on the imaging result of another target disposed between the first imaging unit and the third imaging unit by the first imaging unit, the inspection method further comprising:

acquiring an angle of the third imaging unit with respect to the common housing in top view based on the imaging result of said another target by the first imaging unit, and in said (E), the contact position is corrected based on the imaging results obtained by the second imaging unit and the third imaging unit and the angle of the third imaging unit with respect to the common housing in top view.

10. The inspection method of claim 9, wherein in said (E), any one of the imaging results of said another target by the first imaging unit and the third imaging unit is corrected based on the angle of the third imaging unit with respect to the common housing in the top view, and the contact position is corrected such that the corrected result coincides with the uncorrected result.

11. The inspection method of claim 9, wherein said another target has two marks spaced apart from each other.

12. The inspection method of claim 1, wherein the inspection device has a plurality of the third imaging units, in said (D), each of the plurality of third imaging units images the corresponding target, in said (E), the contact position is corrected based on the imaging results obtained by the plurality of third imaging units.

13. An inspection device for inspecting a substrate, comprising:

a placing member on which the substrate is placed;

a holder configured to hold a probe card having probes to be in contact with electrodes on the substrate;

a first imaging unit configured to recognize the substrate placed on the placing member;

a second imaging unit configured to recognize the probes of the probe card held by the holder;

a target provided at the holder;

a third imaging unit configured to recognize the target;

a moving mechanism configured to detachably hold and move the placing member and move the third imaging unit together with the placing member;

an imaging moving mechanism configured to move the first imaging unit and the second imaging unit; and and a controller;

wherein the controller is configured to execute:

(A) moving the placing member on which the substrate is placed to a position below the probe card held by the holder;

(B) thereafter, imaging the substrate placed on the placing member by the first imaging unit and imaging the probes of the probe card by the second imaging unit from a gap between the probe card and the placing member;

(C) moving the placing member to a reference position in a horizontal direction;

(D) lifting the placing member from the reference position and imaging the target by the third imaging unit; and (E) correcting a contact position, which is calculated from positions of the probes based on imaging results obtained by the first imaging unit and the second imaging unit in said (B), based on an imaging result obtained by the third imaging unit in said (D).

14. The inspection device of claim 13, wherein the reference position of the placing member is a position where a horizontal position of the third imaging unit is located at a predetermined position based on the target, in said (D), the reference position is calibrated based on the imaging result of the target by the third imaging unit, and in said (E), the contact position is corrected based on the calibrated reference position.

15. The inspection device of claim 14, further comprising:

an imaging part having a common housing to which the first imaging unit and the second imaging unit are fixed, wherein the imaging moving mechanism moves the first imaging unit and the second imaging unit by moving the housing of the imaging part, and said (C) includes:

moving the common housing such that an optical axis of the second imaging unit and the target coincide, moving the placing member such that the third imaging unit and the first imaging unit become coaxial.

16. The inspection device of claim 14, wherein the predetermined position is a position directly below the target where an optical axis of the third imaging unit coincides with the target.

17. The inspection device of claim 16, wherein said (C) includes:

moving the placing member to the contact position and then to the reference position, calculating an amount of movement of the placing member from the contact position to the reference position, said (D) includes:

lifting the placing member from the reference position to a focal height at which the third imaging unit is focused on the target, and moving the placing member such that the third imaging unit is positioned directly below the target in a state where the placing member is lifted to the focal height, and acquiring a position of the placing member after the movement as the calibrated reference position, and said (E) includes:

calculating a contact position after correction based on the calibrated reference position and the amount of movement of the placing member from the contact position to the reference position.

18. The inspection device of claim 13, wherein the reference position of the placing member is the contact position before correction.

19. The inspection device of claim 18, further comprising:

an imaging part having a common housing to which the first imaging unit and the second imaging unit are fixed, wherein the imaging moving mechanism moves the first imaging unit and the second imaging unit by moving the housing of the imaging part, said (D) includes:

moving the common housing such that the first imaging unit and the third imaging unit become coaxial in a state where the placing member is moved to the contact position before correction, thereafter, imaging the target by the second imaging unit in a state where the first imaging unit and the third imaging unit are coaxial, thereafter, lifting the placing member from the contact position before correction and imaging the target by the third imaging unit, and in said (E), the contact position is corrected based on the imaging results of the target by the second imaging unit and the third imaging unit.

20. The inspection device of claim 19, wherein in said (E), the contact position is corrected such that the imaging result of the target by the second imaging unit and the imaging result of the target by the third imaging unit coincide with each other.

21. The inspection device of claim 19, wherein said moving the common housing in said (D) includes moving the common housing based on an imaging result of another target disposed between the first imaging unit and the third imaging unit by the first imaging unit, wherein the controller is configured to further execute acquiring an angle of the third imaging unit with respect to the common housing in top view based on the imaging result of said another target by the first imaging unit, and in said (E), the contact position is corrected based on the imaging results obtained by the second imaging unit and the third imaging unit and the angle of the third imaging unit with respect to the common housing in top view.

22. The inspection device of claim 21, wherein in said (E), any one of the imaging results of said another target by the first imaging unit and the third imaging unit is corrected based on the angle of the third imaging unit with respect to the housing in top view, and the contact position is corrected such that the corrected result coincides with the uncorrected result.

23. The inspection device of claim 21, wherein said another target has two marks spaced apart from each other.

24. The inspection device of claim 13, wherein the inspection device has a plurality of the third imaging units, in said (D), each of the third imaging units images the corresponding target, and in said (E), the contact position is corrected based on the imaging results obtained by the plurality of the third imaging units.

* * * * *